(12) United States Patent
Guo et al.

(10) Patent No.: US 10,580,918 B2
(45) Date of Patent: Mar. 3, 2020

(54) DECORATIVE DUAL-FUNCTION PHOTOVOLTAIC DEVICES GENERATING ANGLE INSENSITIVE TRANSMISSIVE OR REFLECTIVE COLORS

(71) Applicant: THE REGENTS OF THE UNIVERSITY OF MICHIGAN, Ann Arbor, MI (US)

(72) Inventors: Lingjie Jay Guo, Ann Arbor, MI (US); Jae Yong Lee, Ann Arbor, MI (US); Kyu-Tae Lee, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 491 days.

(21) Appl. No.: 15/033,516

(22) PCT Filed: Nov. 3, 2014

(86) PCT No.: PCT/US2014/063706
§ 371 (c)(1),
(2) Date: Apr. 29, 2016

(87) PCT Pub. No.: WO2015/066623
PCT Pub. Date: May 7, 2015

(65) Prior Publication Data
US 2016/0254403 A1    Sep. 1, 2016

Related U.S. Application Data

(60) Provisional application No. 61/899,011, filed on Nov. 1, 2013.

(51) Int. Cl.
*H01L 31/0468* (2014.01)
*H01L 31/054* (2014.01)
(Continued)

(52) U.S. Cl.
CPC .. *H01L 31/0468* (2014.12); *H01L 31/022425* (2013.01); *H01L 31/03762* (2013.01);
(Continued)

(58) Field of Classification Search
CPC ............... H01L 31/0468; H01L 31/055; H01L 31/0725; H01L 31/076; H01L 31/1013;
(Continued)

(56) References Cited

U.S. PATENT DOCUMENTS

| 5,439,533 A * | 8/1995 | Saito ................. H01L 31/03921 136/255 |
| 2004/0121163 A1 | 6/2004 | Laird |

(Continued)

OTHER PUBLICATIONS

Cattin et al. "Toward indium-free optoelectronic devices:Dielectric/metal/dielectric alternative transparent conductive electrode in organic photovoltaic cells", Phys. Status Solidi A 210, No. 6, pp. 1047-1061. (Year: 2013).*
(Continued)

*Primary Examiner* — Daniel P Malley, Jr.
(74) *Attorney, Agent, or Firm* — Harness, Dickey & Pierce, P.L.C.

(57) ABSTRACT

The present disclosure provides dual-function photovoltaic (PV) devices that generate electric current and have a colored surface or colored appearance. The PV devices may be angle insensitive and polarization independent. Such a dual-function PV device may have an ultra-thin photoactive layer (e.g., comprising an undoped amorphous silicon) with a thickness of ? about 50 nm. The PV device is configured to filter (transmit or reflect) a portion of an electromagnetic spectrum, providing a controllable and tunable color appearance. Such nanometer a-Si/organic hybrid cells are designed to transmit or reflect angle insensitive colors, electrically powering up to 2% to 3% or higher by efficient absorbed photon to charge conversion. In certain variations, the pres-
(Continued)

Figures 2A, 2B, 2C:
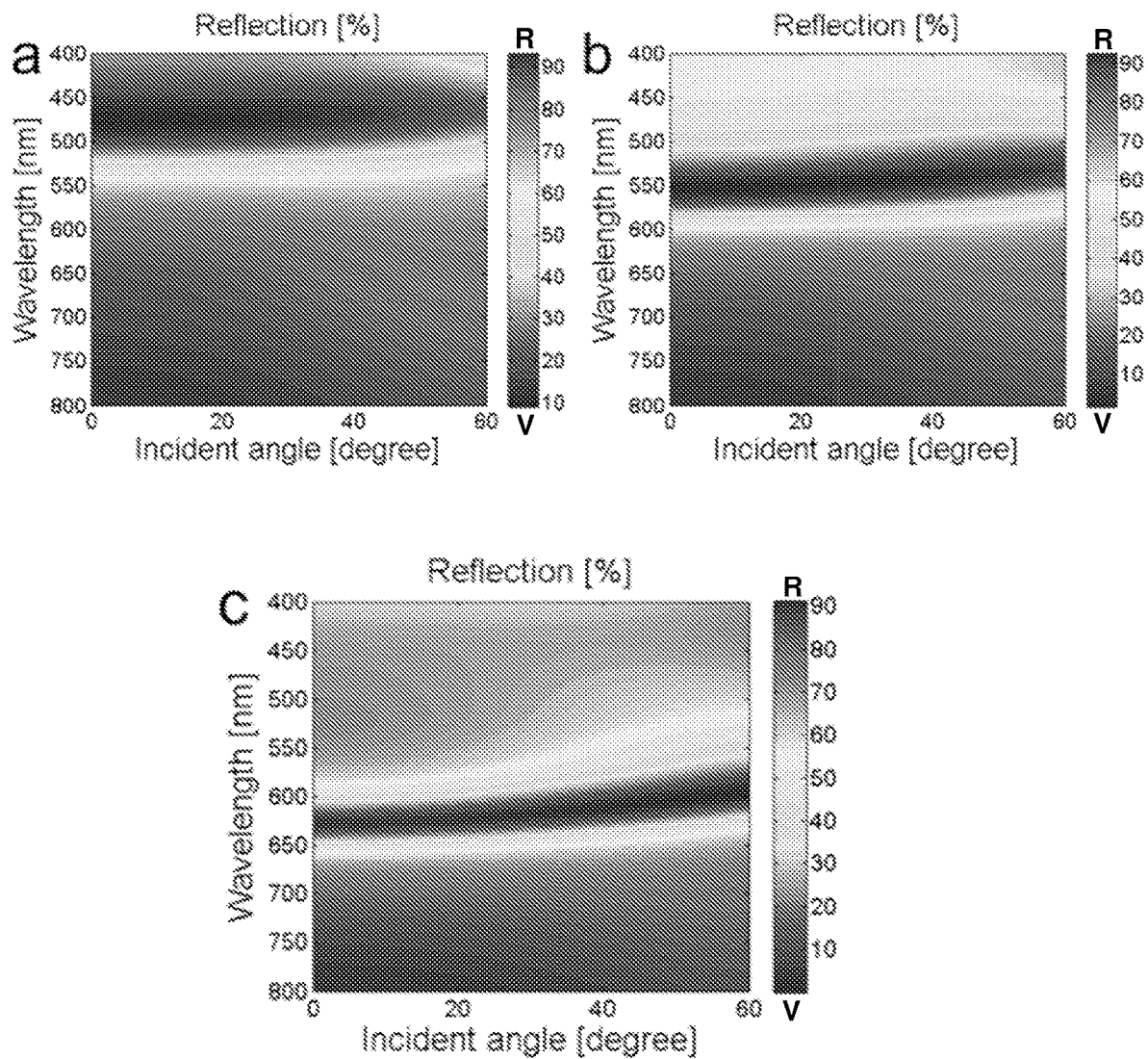

ent disclosure further provides decorative power generating panels creating angle insensitive transmissive or reflective colors.

22 Claims, 21 Drawing Sheets

(51) Int. Cl.
H01L 31/0224 (2006.01)
H01L 31/0376 (2006.01)
H01L 31/20 (2006.01)
H01L 31/0256 (2006.01)

(52) U.S. Cl.
CPC .......... H01L 31/054 (2014.12); H01L 31/202 (2013.01); *H01L 2031/0344* (2013.01)

(58) Field of Classification Search
CPC ........... H01L 27/14692; H01L 31/0392; H01L 31/0445
See application file for complete search history.

(56) References Cited

U.S. PATENT DOCUMENTS

| | | |
|---|---|---|
| 2007/0132843 A1 | 6/2007 | Miles |
| 2009/0101192 A1 | 4/2009 | Kothari et al. |
| 2011/0036391 A1 | 2/2011 | McCormick et al. |
| 2011/0036404 A1* | 2/2011 | Tomita ................. H01G 9/2031 136/258 |
| 2011/0189812 A1 | 8/2011 | Brabec et al. |
| 2013/0061915 A1* | 3/2013 | Myong ................. H01L 31/075 136/255 |
| 2014/0007935 A1* | 1/2014 | Mutitu .............. H01L 31/02165 136/256 |
| 2014/0238482 A1* | 8/2014 | Ichibayashi ............. C07C 13/64 136/256 |

OTHER PUBLICATIONS

Yang et al., "Dopant-Free Hydrogenated Amorphous Silicon Thin-Film Solar Cells Using Molybdenum Oxide and Lithium Fluoride", Oct. 21, 2013, The Journal of Physical Chemistry, 177, All Pges (Year: 2013).*

Seo et al., "Highly efficient hybrid thin-film solar cells using a solution-processed hole-blocking layer", Dec. 13, 2012, Phys. Chem. Chem. Phys., 15, All Pages. (Year: 2012).*

Yang et al., "Dopant-Free Hydrogenated Amorphous Silicon Thin-Film Solar Cells Using Molybdenum Oxide and Lithium Fluoride"), 2013, The Journal of Physical Chemistry, All Pages. (Year: 2013).*

International Search Report and Written Opinion of the International Searching Authority (ISA/KR) issued in PCT/US2014/063706, dated Feb. 9, 2015.

* cited by examiner

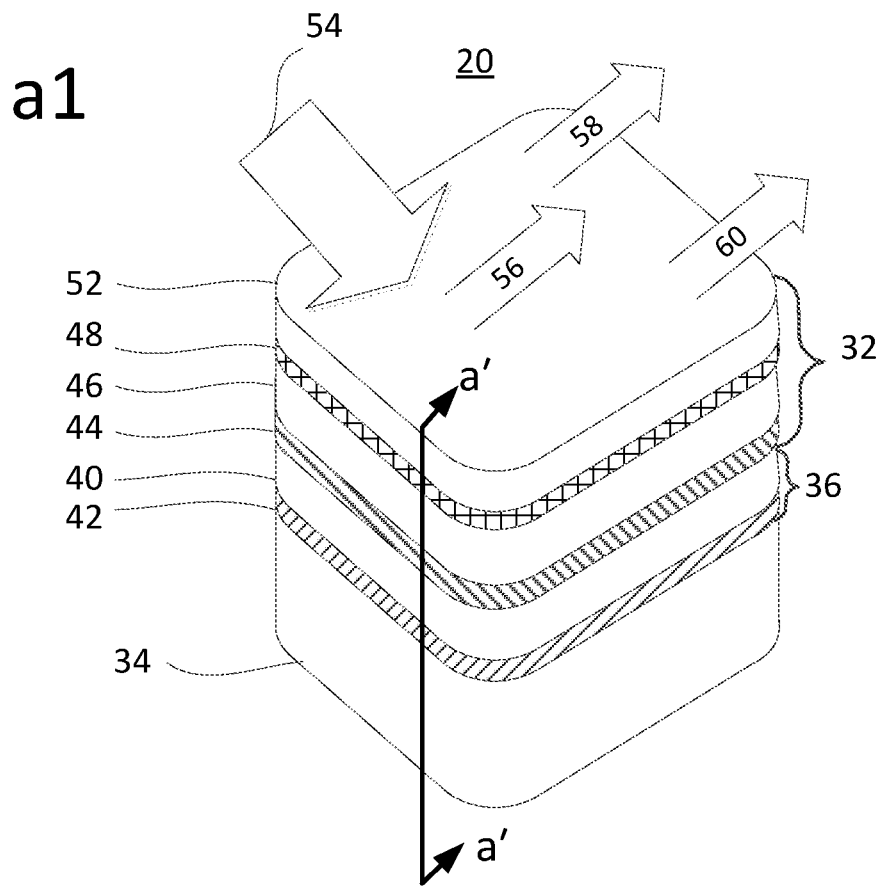
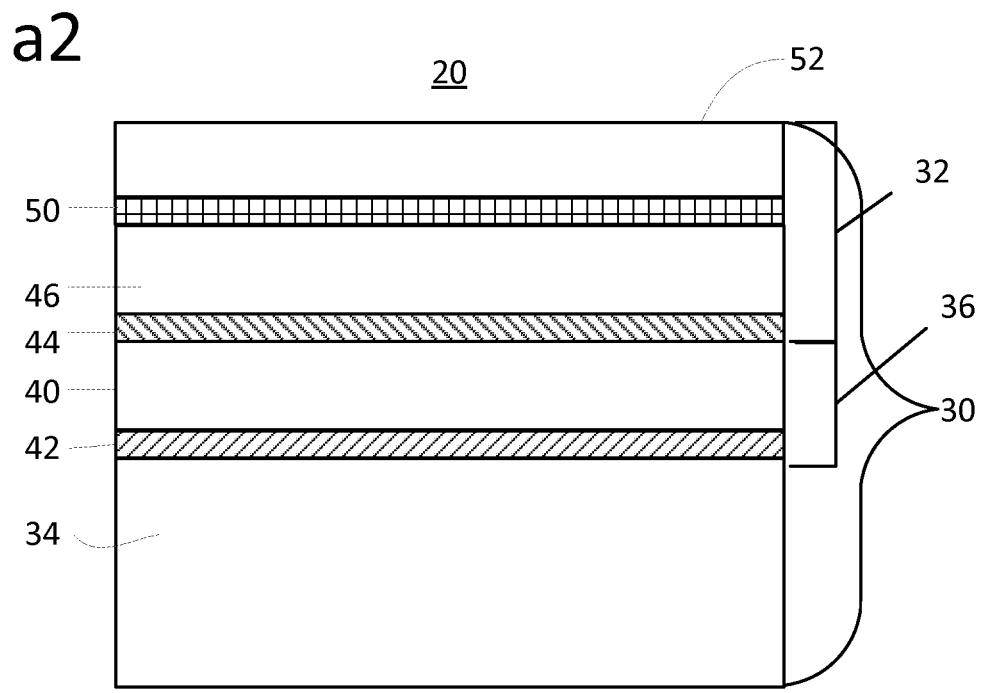
Figures 1(a)(1)-1(a)(2)

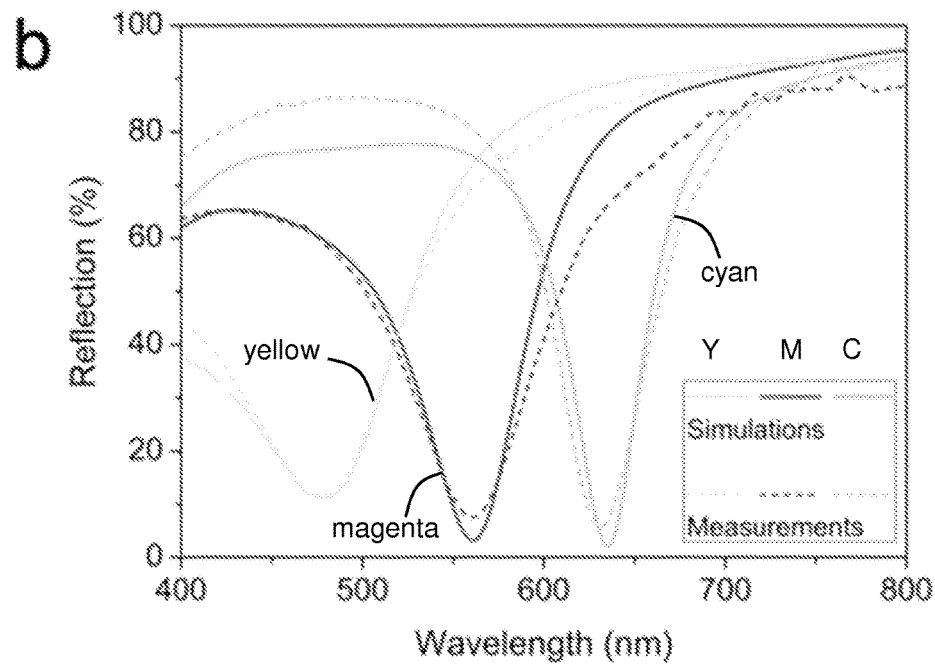
Figure 1(b)
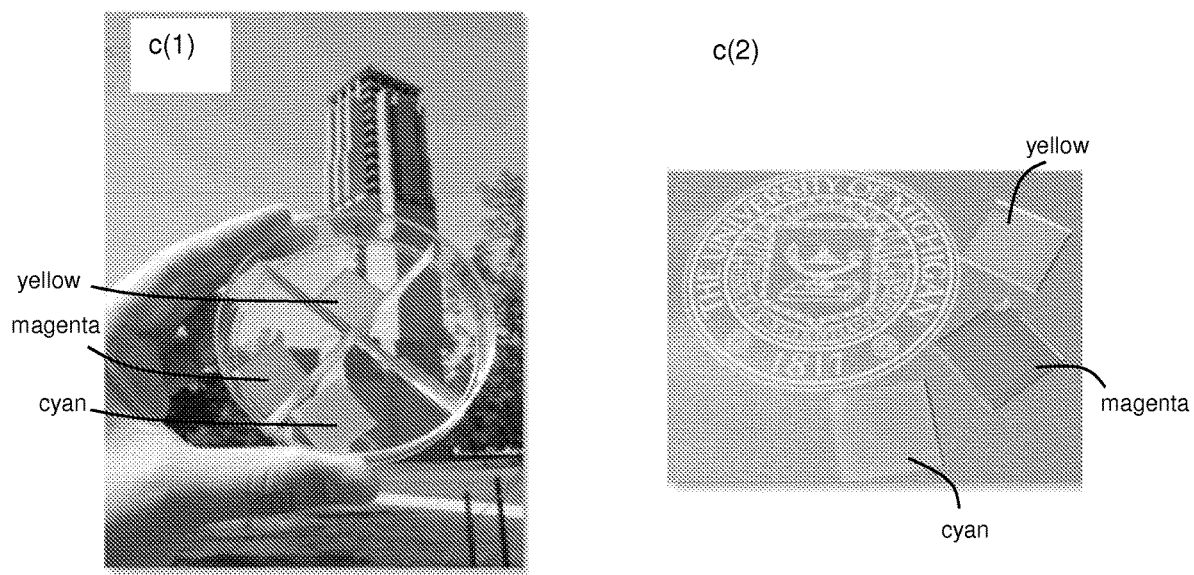
Figures 1(c)(1) – 1(c)(2)

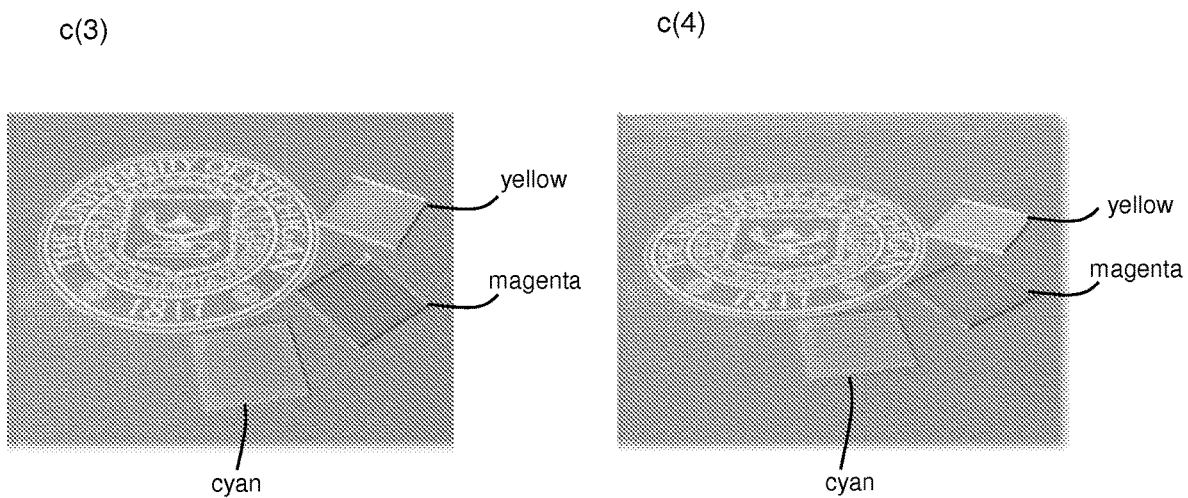
Figures 1(c)(3) – 1(c)(4)

g h i

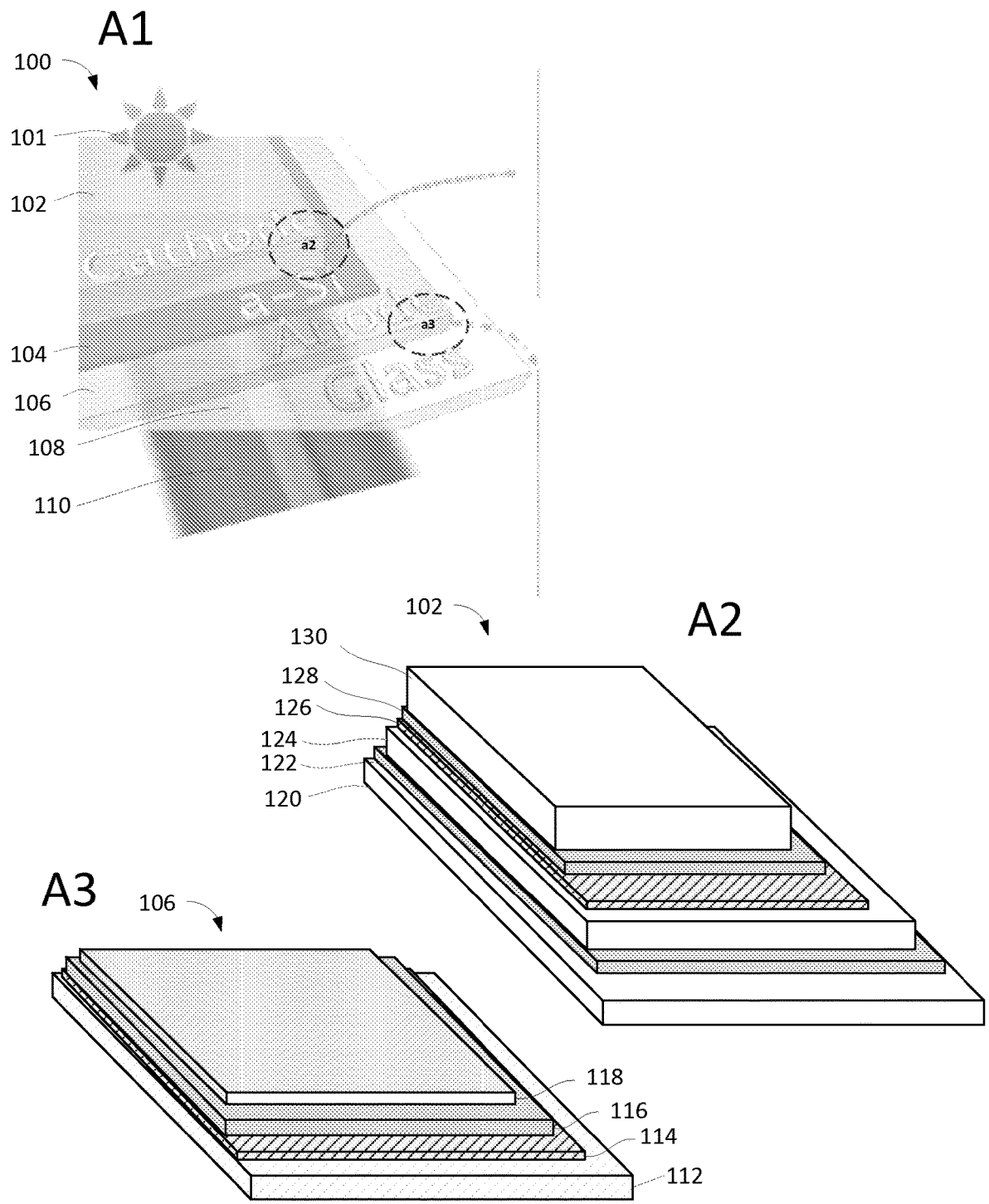
Figures 6(a)(1)-6(a)(3)

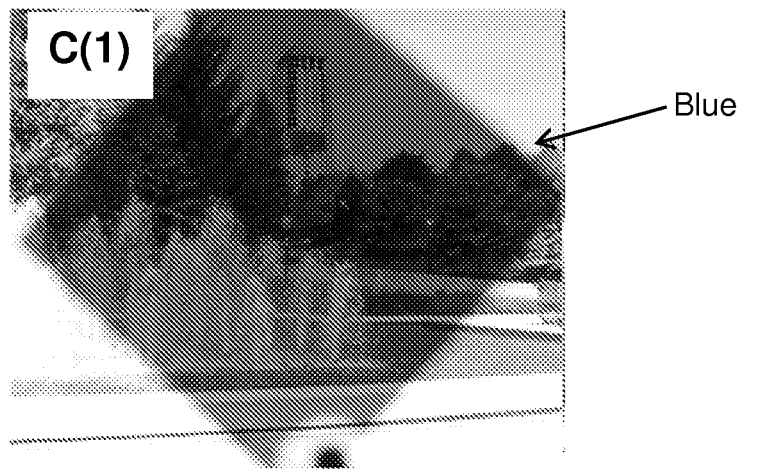
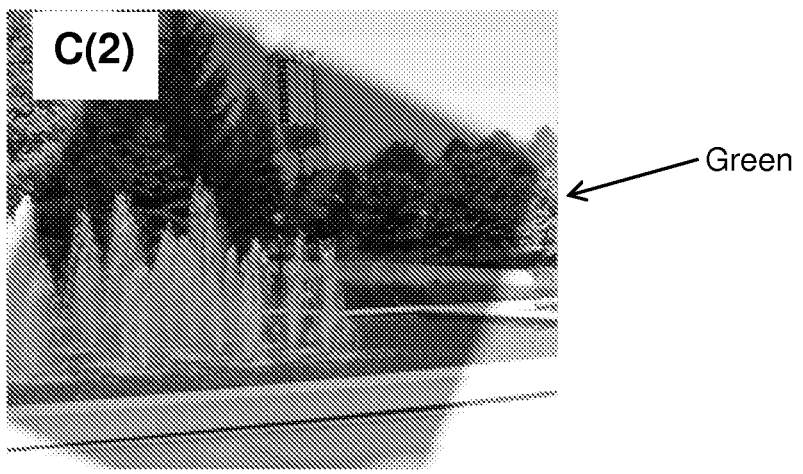
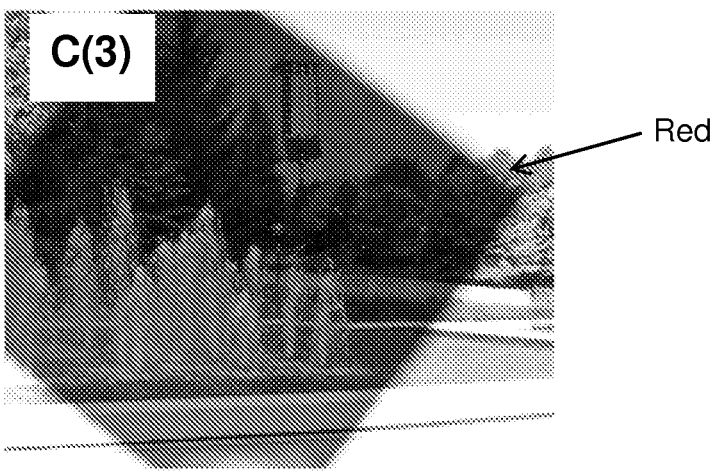
Figure 6(c)(1) – 6(c)(3)

Figures 9(a) – 9(b)(5)

DECORATIVE DUAL-FUNCTION PHOTOVOLTAIC DEVICES GENERATING ANGLE INSENSITIVE TRANSMISSIVE OR REFLECTIVE COLORS

CROSS-REFERENCE TO RELATED APPLICATIONS

This application is a National Stage of International Application No. PCT/US2014/063706 filed Nov. 3, 2014 (Publication No. WO 2015/066623 published May 7, 2015), which claims the benefit of U.S. Provisional Application No. 61/899,011, filed on Nov. 1, 2013. The entire disclosure of each the above applications is respectively incorporated herein by reference.

FIELD

The present disclosure relates to angle insensitive dual-function photovoltaic devices capable of generating electric current and transmissive or reflective filtered colors.

BACKGROUND

This section provides background information related to the present disclosure which is not necessarily prior art.

Most current solar panels, including inorganic thin-film photovoltaics (PVs), are fabricated via complex processes using expensive semiconductor materials, and they are rigid and heavy with a dull, black appearance. The black color of the traditional PV panels is due to use of a thick semiconductor layer to absorb most incident light. Because of their non-aesthetically appealing appearance and weight, they are primarily installed on rooftops to minimize their negative impact on building appearance and aesthetics. As such, large surfaces and interiors of modern buildings are not efficiently utilized for potential electric power generation. This unattractive appearance limits the seamless integration with the interior as well as the exterior of existing architectures, such as facades, skylight, windows, and sidewalls. Thus, there is a strong demand to develop thin-film PVs that can offer design features, accompanying a variety of distinct colors.

Thus, inorganic thin-film solar panels have remained largely unexploited in creating various colors, which is primarily attributed to a photoactive layer having to be a few hundred nanometers thick. Such conventional inorganic thin-film solar cells require a minimum thickness of photoactive layers, which is mainly due to the doped regions forming an internal electric field in the active layer. For example, a photoactive layer of conventional thin-film amorphous silicon (a-Si) PV cells needs to be thick enough to accommodate the doped regions and intrinsic undoped layer in between. The doped layers are each at least 40 to about 50 nm thick to allow for proper photovoltaic operation. The doping in a-Si photoactive layer has been optimized over the last several decades to ensure that the intrinsic layer has a strong internal electric field for efficient charge extraction. In the doped regions of a-Si, photogenerated charges inevitably become recombined with the intended dopants, leading to substantial electric charge loss. However, ironically, the doped regions do not contribute to electric charge generation since photogenerated charges in doped a-Si are recombined by dopants, so-called defects. In addition, the inevitably thick a-Si active layer is subject to light-induced degradation, so that traditional a-Si solar cells have struggled to be implemented in practical use.

Integration of organic PVs with the color filters employing certain nanostructures has been previously proposed to simultaneously generate electric power and produce colors. However, an incident angle tolerance, one of the most important features, was not satisfactory. Even with the incorporation of any other plasmonic and photonic subwavelength grating based color filters, the incident angle dependent property is still a very challenging issue. Further, the organic based filters have not been desirable, as they suffer from degradation of the performance over time by long-standing ultraviolet illumination, heat, and chemical reactions. For example, organic photovoltaics are known to suffer from oxygen and moisture sensitivity and have short lifetimes. Further, these types of photovoltaics are also difficult to scale to practical large areas.

Because color filters have been used in a variety of display technologies as well as light emitting products, their integration with an ultra-thin a-Si photoactive layer would be desirable for colored photovoltaic panels. However, in practical applications, most nanostructure based plasmonic and photonic color filters have faced challenges in shifting a resonance, which occurs when light is incident upon the device at different angles of incidence. This resonance shift results in an undesirable color change, dramatically limiting the use of this type of filter. Therefore, there is a need to develop an incident angle robust color generating design for photovoltaic cells.

SUMMARY

This section provides a general summary of the disclosure, and is not a comprehensive disclosure of its full scope or all of its features.

In certain aspects, the present disclosure provides a dual-function photovoltaic device, which may generate electric current and create a colored surface appearance by transmission or reflection. The dual-function device comprises an anode, a cathode, and a photoactive layer assembly disposed between the anode and cathode. The photoactive layer assembly comprises a semiconductor active layer, a first charge transport layer, and a second charge transport layer sandwiching the semiconductor active layer. The dual-function photovoltaic device is configured to generate electric current and to reflect or transmit a filtered output displaying minimal angle dependence for a predetermined range of electromagnetic wavelengths in a visible range.

In other aspects, the present disclosure provides a dual-function colored photovoltaic device comprising an anode, a cathode, and an ultra-thin photoactive layer disposed between the anode and cathode. The ultra-thin photoactive layer comprises an amorphous silicon (a-Si) material substantially free of doping having a thickness of less than or equal to about 50 nm. The dual-function colored photovoltaic device is configured to filter a portion of an electromagnetic spectrum in the photoactive layer to generate electric current and to generate a filtered output displaying minimal polarization dependence and minimal angle dependence for a predetermined range of electromagnetic wavelengths to generate a colored surface on the dual-function colored photovoltaic device.

In yet other aspects, a dual-function photovoltaic device is contemplated that comprises an anode comprising a dielectric-metal-dielectric structure, a cathode, and a photoactive layer assembly disposed between the anode and cathode. The photoactive layer assembly comprises an ultra-thin photoactive layer comprising an undoped amorphous silicon and an organic charge transport layer interadjacent to the ultra-thin photoactive layer and the cathode.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1(a)(1)-1(c)(4) show ultra-thin hybrid solar cells with angle invariant color generation. FIGS. 1(a)(1)-1(a)(2) show an exemplary dual-function hybrid cell photovoltaic device according to certain aspects of the present disclosure. FIG. 1(a)(1) shows electromagnetic light directed at the dual-function hybrid cell having a cathode (comprising thick silver (Ag)) organic layers, and a dielectric-metal-dielectric (DMD) structure for an anode. Between the two electrodes, an ultra-thin semiconductor layer comprising a-Si layer is located. Three colors are reflected from the dual-function hybrid cell photovoltaic device. FIG. 1(a)(2) is a cross-sectional view taken along line a'-a' in FIG. 1(a)(1). FIG. 1(b) shows calculated (solid lines) and measured (dotted lines) reflection spectra of cyan, magenta, and yellow (CMY) colors at normal incidence. The thicknesses of a-Si layer for CMY colors are 27, 18, and 10 nm, respectively, given fixed thicknesses of all the other layers indicated in FIG. 1(a). FIG. 1(c)(1)-1(c)(4) show images of the fabricated colored PV devices showing CMY colors. FIGS. 1(c)(2)-1(c)(4) show the fabricated colored PV devices at various angles of incidence (15°, 30°, and 60°. The colored cells clearly demonstrate the angle insensitive performance at large angles of incidence, showing high contrast and no change in appearance of color even at high viewing angles.

Figures 2D, 2E, 2F:
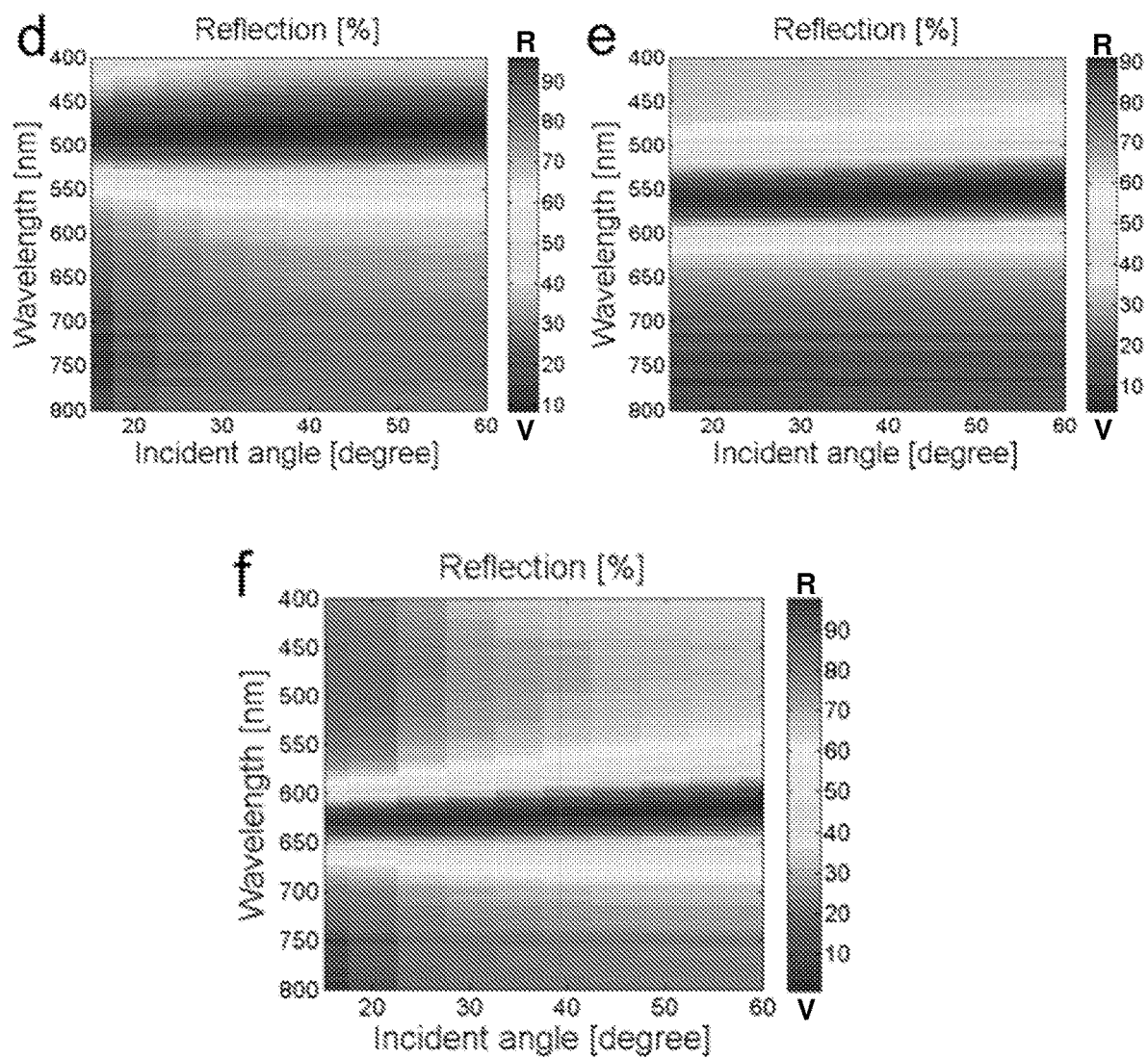
Figure 2G:
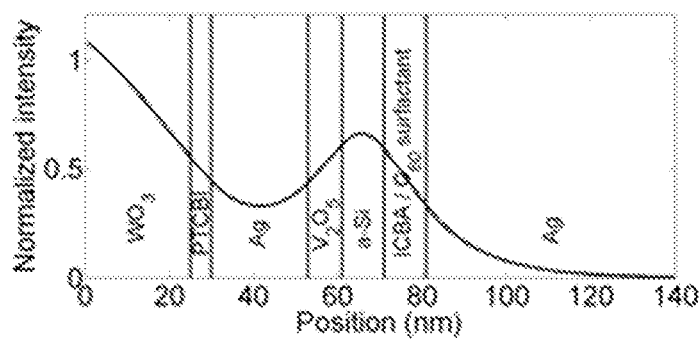
Figure 2H:
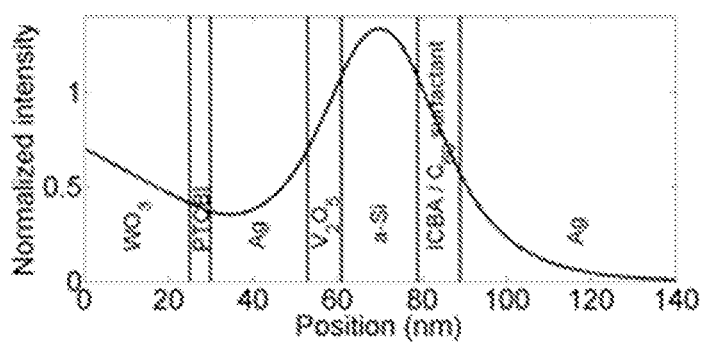
Figure 2I:
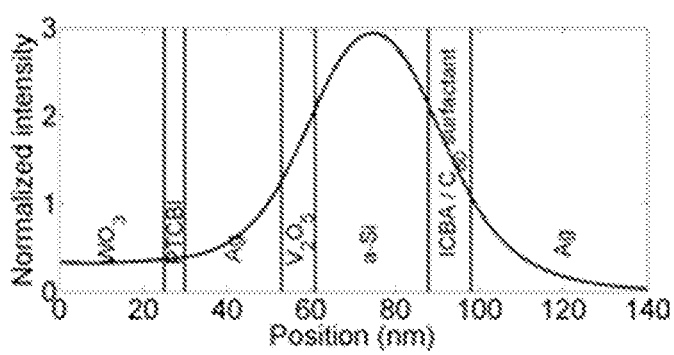

FIGS. 2(a)-2(i) show incidence angle behaviors of dual function photovoltaic devices prepared in accordance with certain aspects of the present teachings for p-polarized light. FIGS. 2(a)-2(c) show dispersion curves obtained from simulation (transfer matrix method) for yellow (10 nm), magenta (18 nm), and cyan (27 nm), respectively, demonstrating flat dispersion curves, which indicate that the devices have a low sensitivity to angles of incidence ranging from 0° to 60°. The color maps represent the value of light reflection. FIGS. 2(d)-2(f) show experimental dispersion curves measured by an ellipsometer corresponding to those in FIGS. 2(a)-2(c). FIGS. 2(g)-2(i) show the normalized intensity distribution of an electric field inside an a-Si photoactive layer at the resonance for each individual color corresponding to FIGS. 2(a)-2(c).

Figures 3A, 3B:
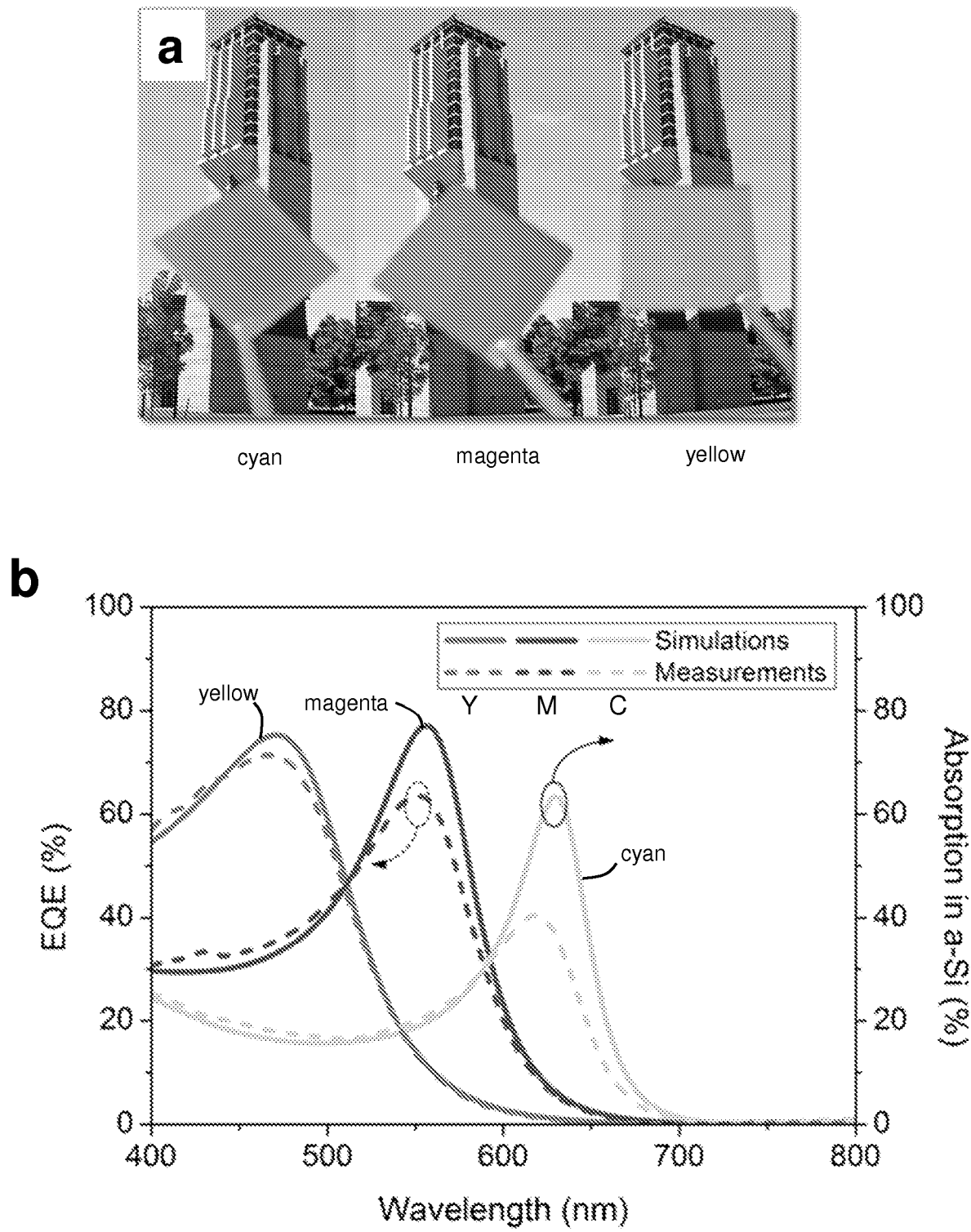
Figure 3C:
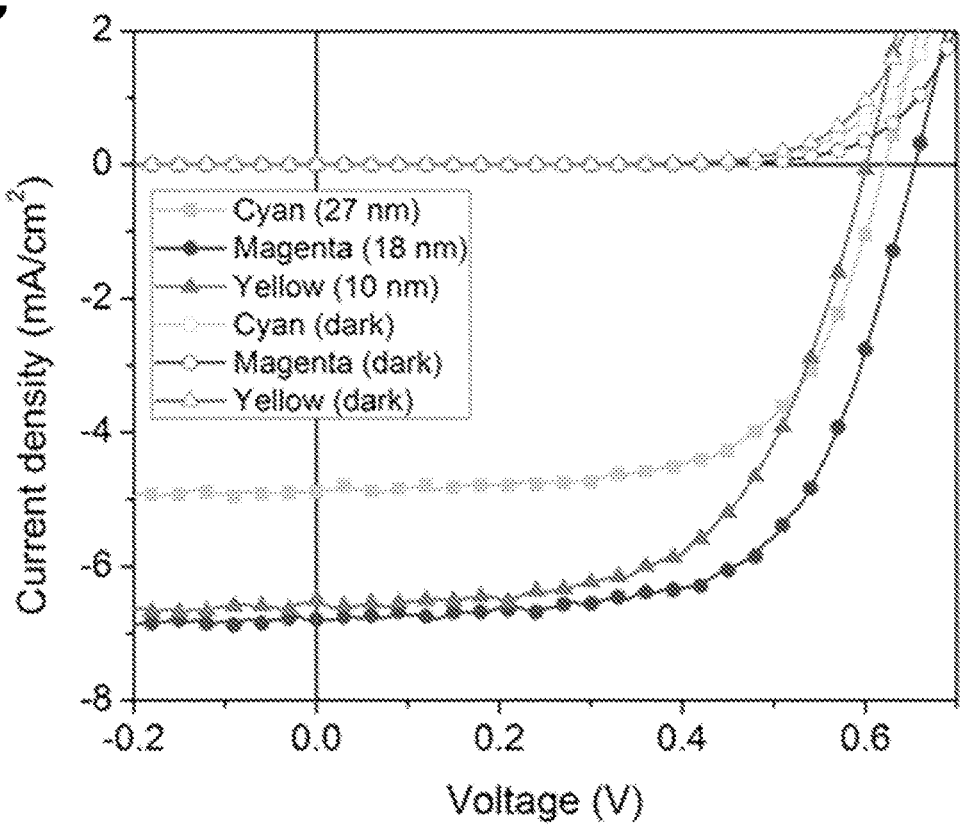
Figure 3D:
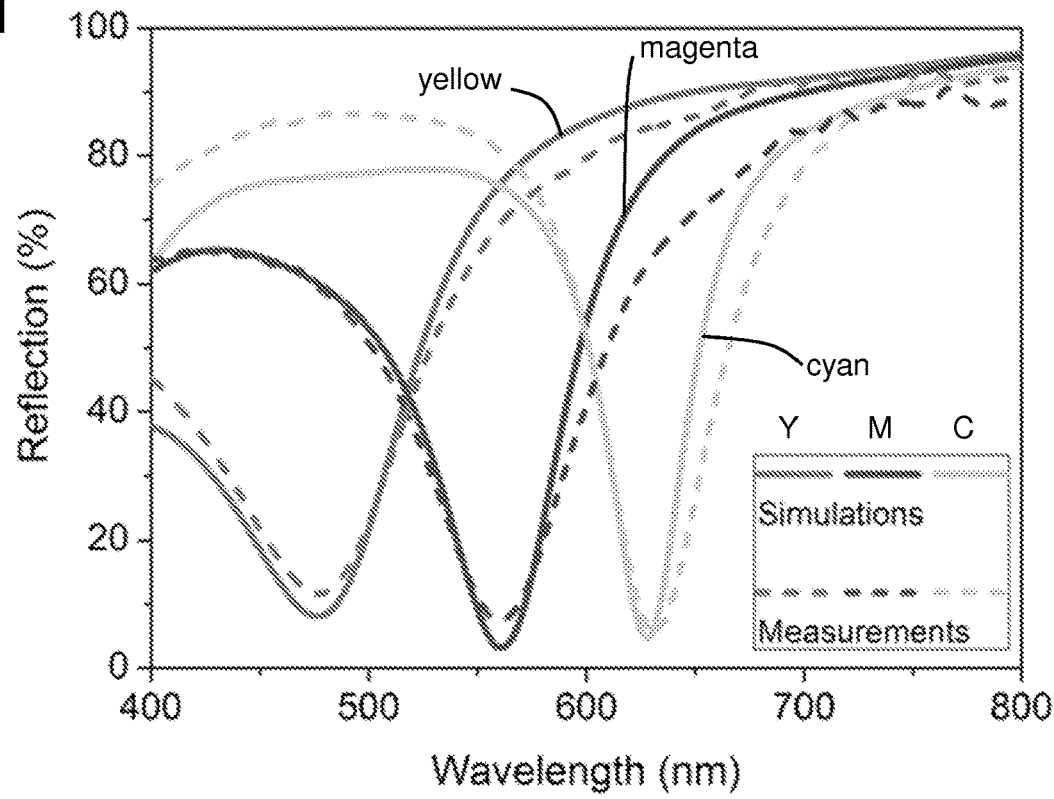

FIGS. 3(a)-3(d) show electrical characterizations of fabricated dual-function devices prepared in accordance with certain aspects of the present teachings. FIG. 3(a) shows a photograph of the devices reflecting cyan, magenta, and yellow colors. FIG. 3(b) shows measured external quantum efficiency (EQE) spectra and calculated absorption profiles in a-Si layers for three individual colors, cyan, magenta, and yellow. FIG. 3(c) shows measured current density-voltage (J-V) characteristics of individual colored cells under both AM1.5 illumination and dark conditions. FIG. 3(d) shows calculated (solid lines) and measured (dotted lines) reflection spectra of dual-function cyan, magenta, yellow (CMY) devices at normal incidence. The thicknesses of a photoactive layer comprising a-Si layer for the CMY colors are 27, 18, and 10 nm, respectively.

Figure 4A:
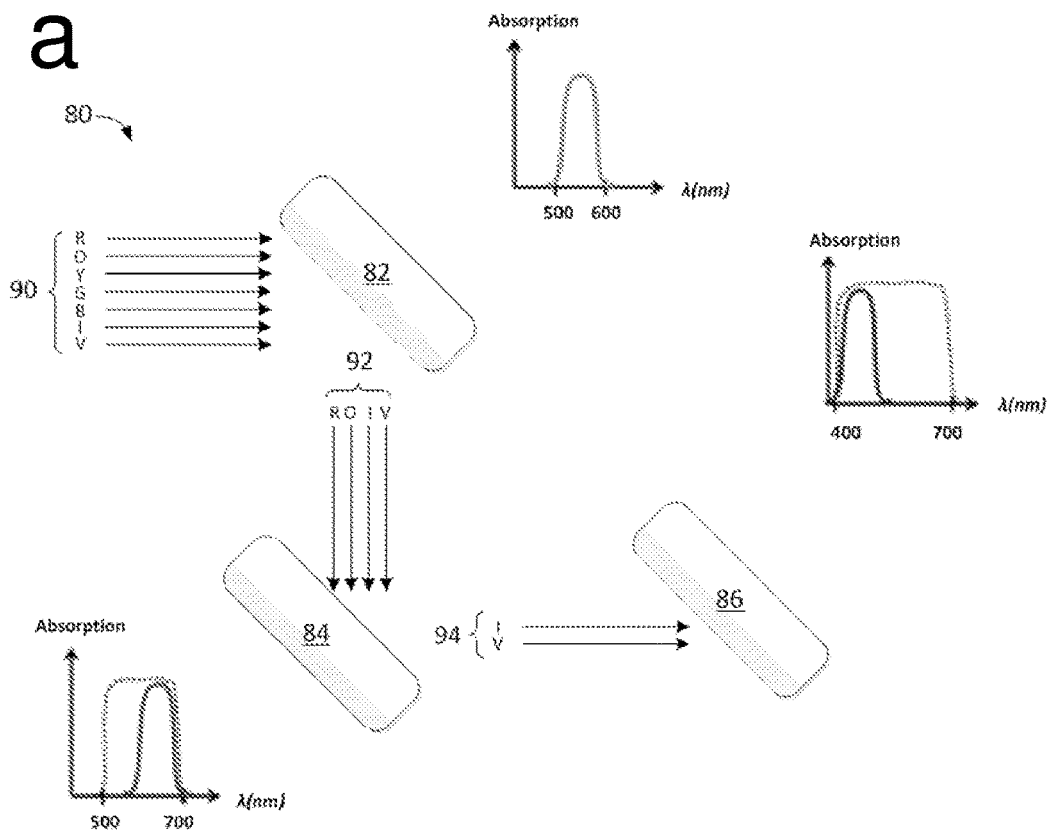
Figure 4B:
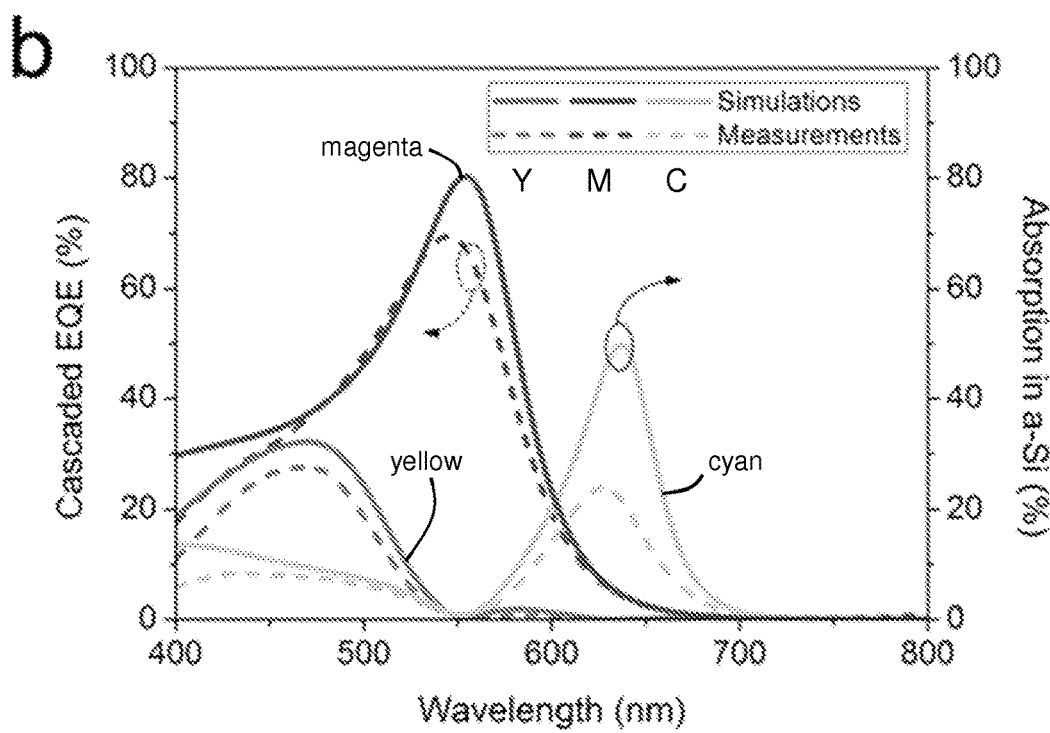
Figure 4C:
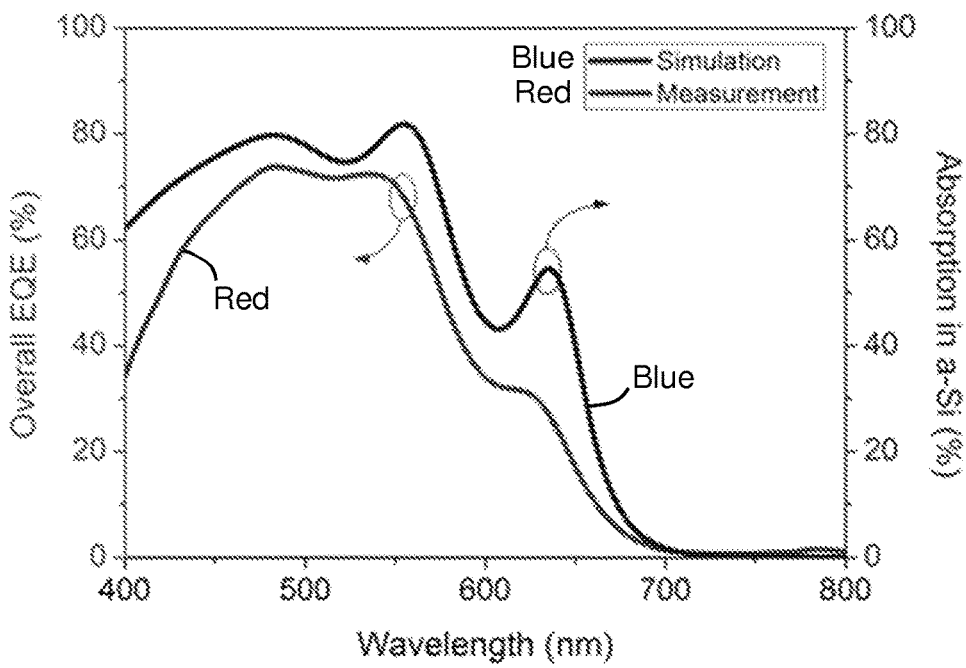
Figure 4D:
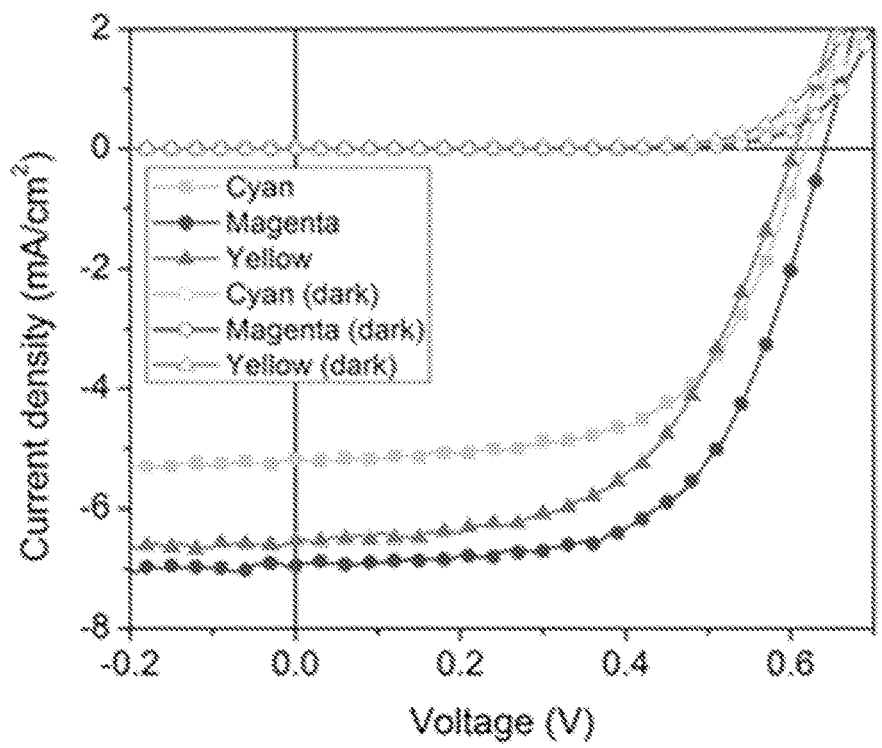
Figure 4E:
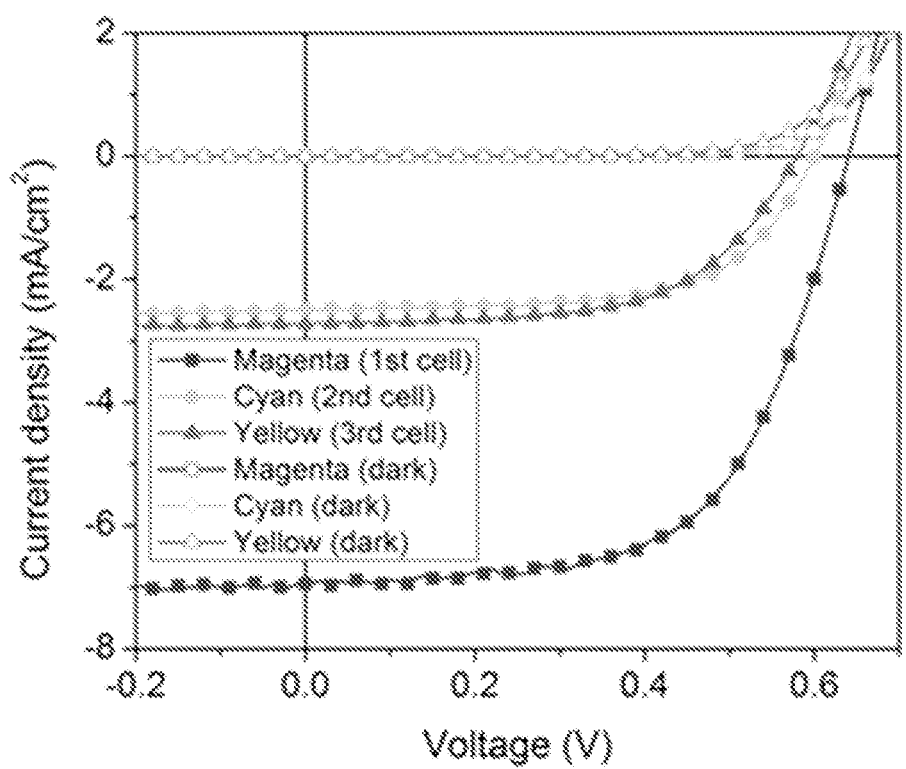

FIGS. 4(a)-4(e) show realization of photon recycling with spectrum splitting of cascaded light absorption. FIG. 4(a) shows a schematic showing the arrangement of each dual-function photovoltaic cell in a cascaded platform configuration for the spectrum splitting. Light is reflected by a first dual-function photovoltaic cell, which mainly absorbs the green spectrum (thus reflecting magenta color, including red, orange, indigo, and violet) and goes toward a second dual-function photovoltaic second cell having a resonance corresponding to the absorption peak at red, which harvests the longer wavelength components (e.g., red and orange). A third dual-function photovoltaic cell is placed after the second dual-function photovoltaic cell (having an absorption peak at the blue), so the remaining part of incident light, which still contains strong blue spectrum, is recycled. FIG. 4(b) shows that after the application of the cascaded platform, the experimentally achieved external quantum efficiency (EQE) data and the corresponding numerical absorption spectra in ultra-thin a-Si layer. FIG. 4(c) shows overall EQE profile attained by adding three individual EQE spectra, and associated simulation result of total absorption in three a-Si layers is compared. FIG. 4(d) shows current density-voltage (J-V) characteristics of the individual CMY cells under AM1.5 illumination. FIG. 4(e) shows J-V performances of the three cells are also measured in the cascaded platform, depicting photon recycling for electric current in consecutive cells.

Figure 5A:
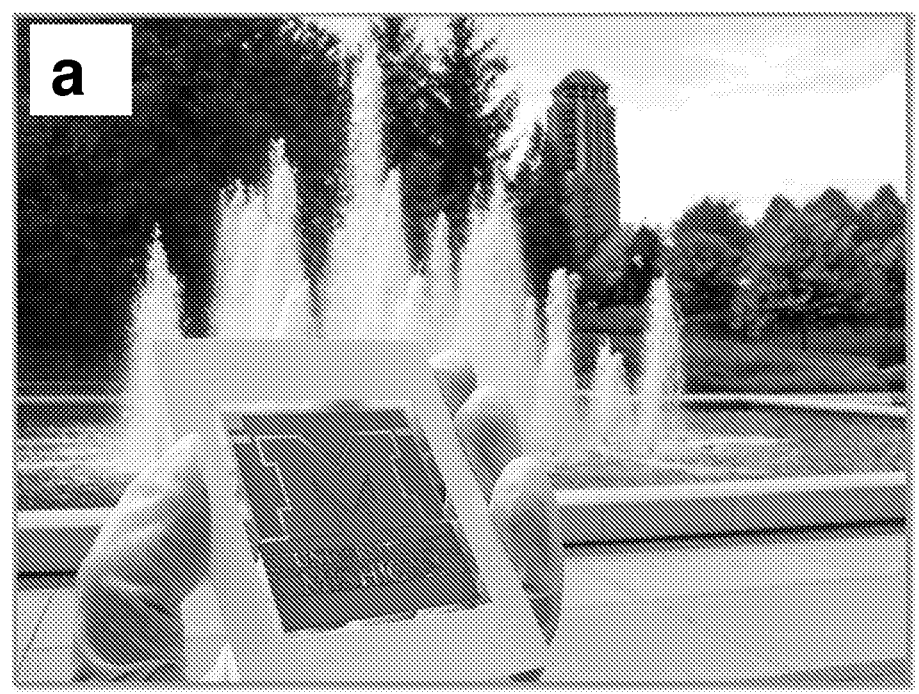
Figure 5B:
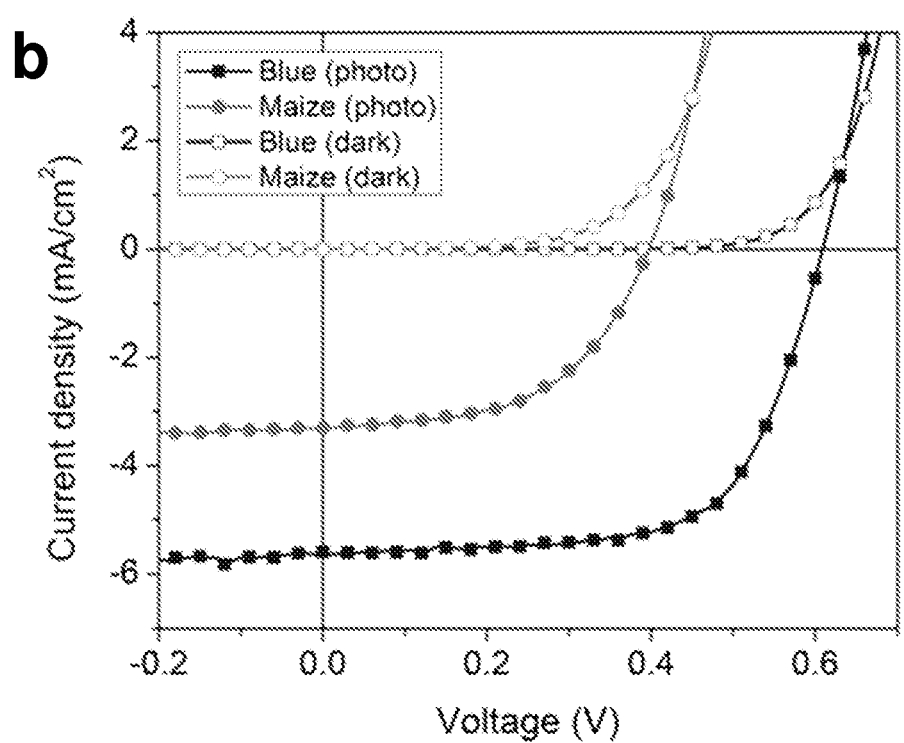

FIGS. 5(a)-5(b) show power-generating University of Michigan (U of M) logo design for a dual-function photovoltaic device. FIG. 5(a) shows a U of M logo design with maize and blue colors for generating electric power under outdoor sunlight illumination. FIG. 5(b) shows current density-voltage characteristics of the maize and blue colored 1 mm diameter devices under AM1.5 illumination.

Figure 6B:
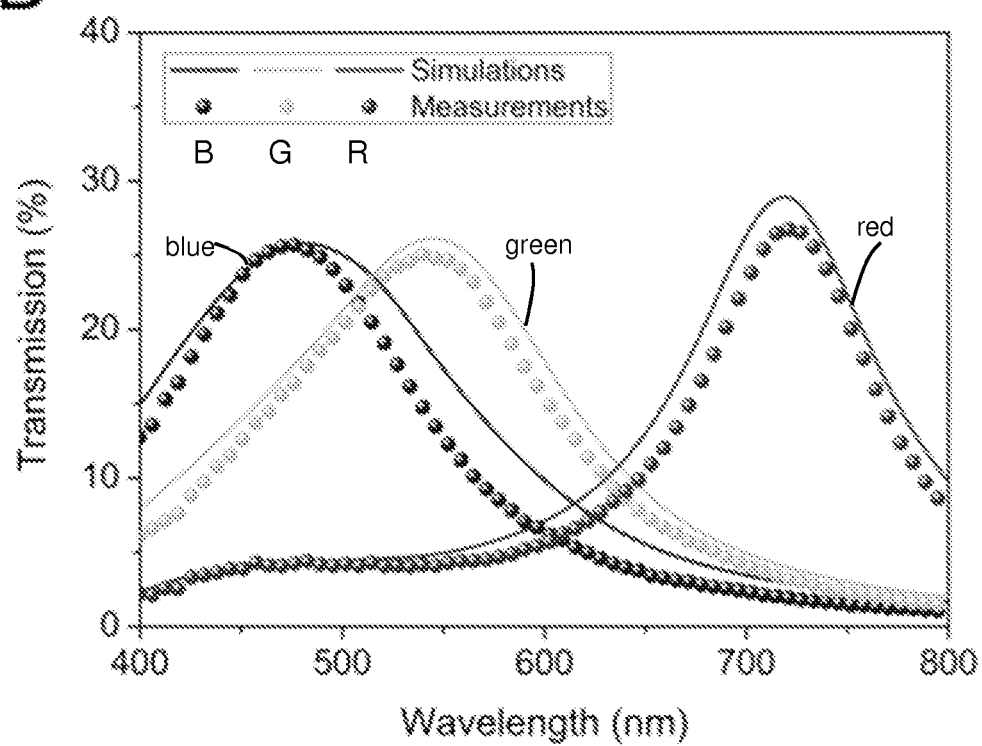

FIGS. 6(a)(1)-6(c)(3) show a schematic dual-function photovoltaic device structure and optical properties. FIGS. 6(a)(1)-6(a)(3) show a schematic diagram of a structure dual-function transmissive photovoltaic device according to certain aspects of the present disclosure. FIG. 6(a)(1) shows a structure comprising a cathode, an anode, and an ultra-thin undoped a-Si photoactive layer. FIG. 6(a)(2) is a detailed view of the cathode in FIG. 6(a)(1), while FIG. 6(a)(3) is a detailed view of the anode of FIG. 6(a)(1). The cathode in FIG. 6(a)(2) is composed of dielectric-metal-dielectric (DMD) and an organic electron transport layer. The anode in FIG. 6(a)(3) has only a DMD structure for the anode. The ultra-thin a-Si photoactive layer thickness is 6 nm, 11 nm, and 31 nm for blue, green, and red, respectively. FIG. 6(b) calculates and measures transmission spectra of individual colors (blue, green, and red) at normal incidence from such a dual-function transmissive photovoltaic device according to certain aspects of the present disclosure. FIGS. 6(c)(1)-6(c)(3) show photographs of distinct blue, green, and red colors by the fabricated dual-function photovoltaic devices.

Figures 7A, 7B, 7C:
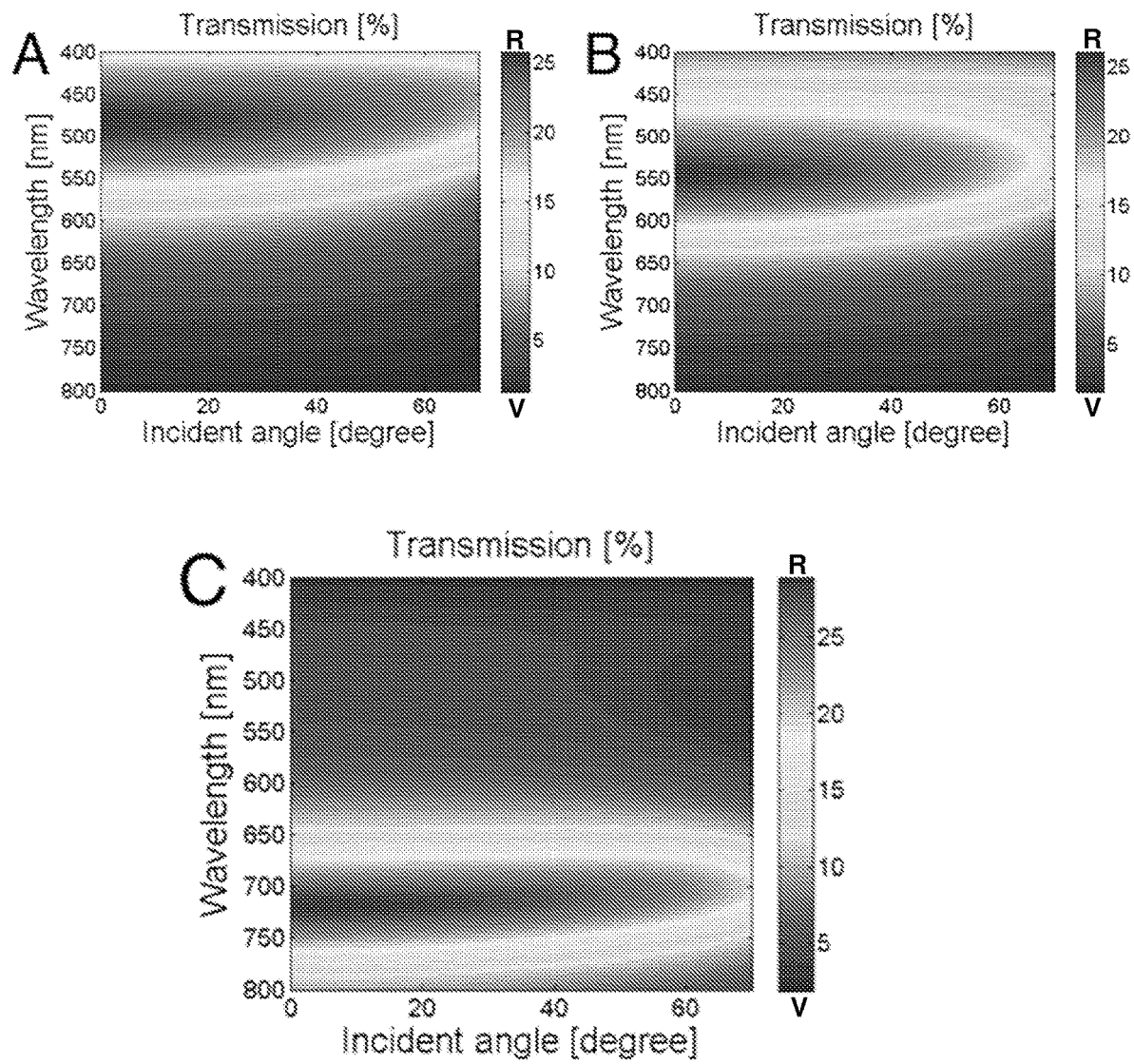
Figures 7D, 7E, 7F:
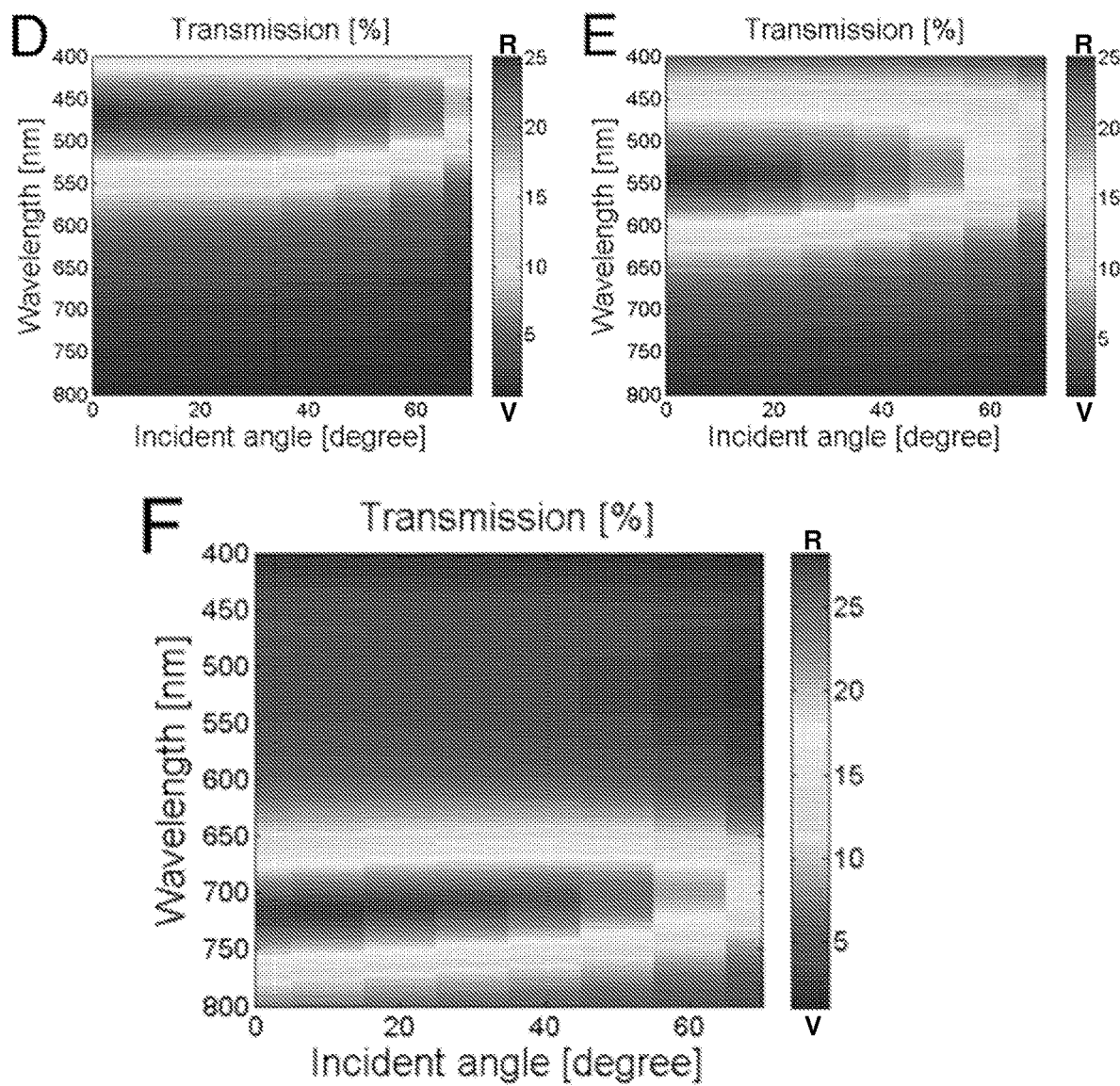

FIGS. 7(a)-7(f) shows simulated and measured angular dependence under unpolarized light illumination for a dual-function photovoltaic prepared in accordance with certain aspects of the present disclosure. FIGS. 7(a)-7(c) show calculated angular behaviors of blue (6 nm), green (11 nm), and red (31 nm), respectively, showing that the resonance corresponding to the peak (red in the color map) in the transmission spectra remains at fairly same level over a relatively large range of angles of incidence up to 70°. The color bars denote how much the light is transmitted through the whole device. FIGS. 7(d)-7(f) are measured incidence angle dependence corresponding to those in FIGS. 7(a)-7(c).

Figures 8A, 8B:
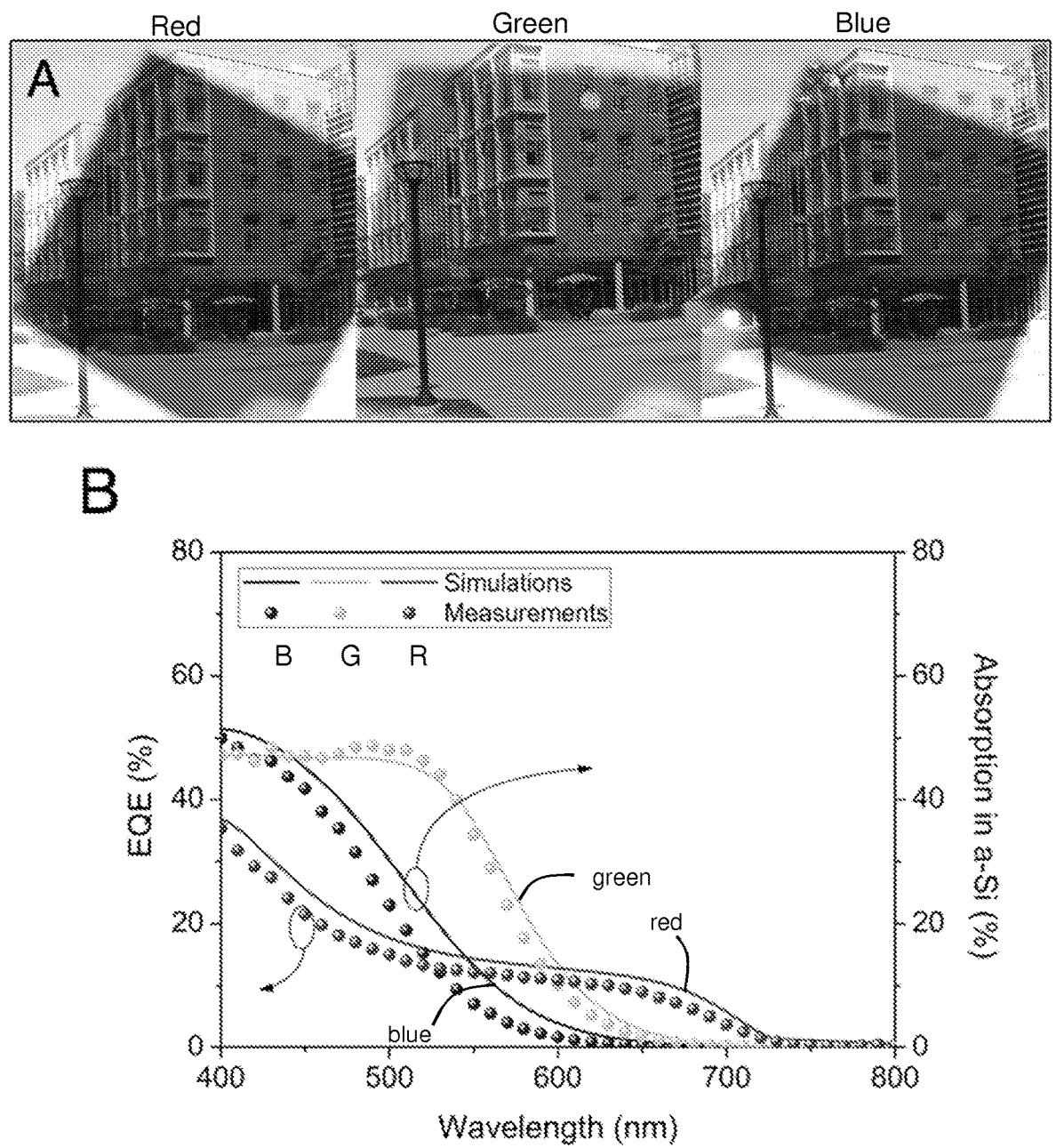
Figure 8C:
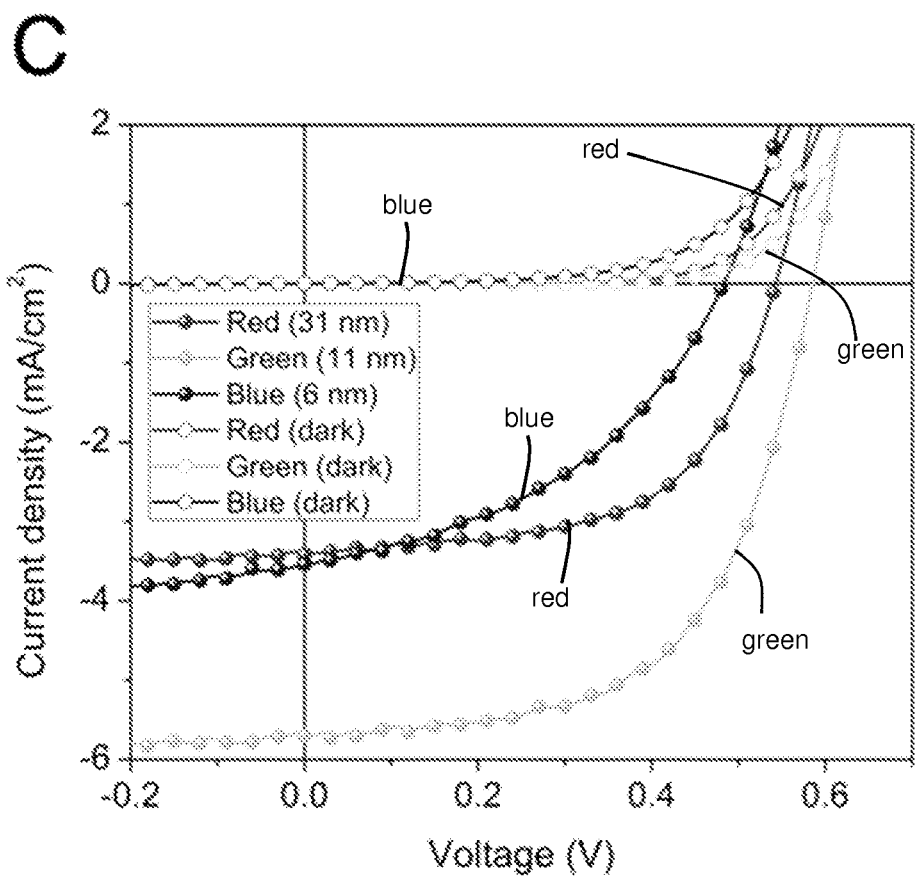

FIGS. 8(a)-8(c) show numerical simulation for a-Si absorption and electrical performance of decorative semi-transparent photovoltaic hybrid cells. FIG. 8(a) shows pictures of dual-function photovoltaic devices prepared in accordance with certain aspects of the present disclosure transmitting red, green, and blue colors. FIG. 8(b) shows a comparison of calculated incident light absorption profiles by ultra-thin a-Si layer and measured external quantum efficiency (EQE) spectra for three different types of dual-function photovoltaic devices (red, green, and blue). FIG. 8(c) shows current density-voltage characteristics of the dual-function hybrid cells under AM1.5 illumination and dark conditions.

Figure 9C:
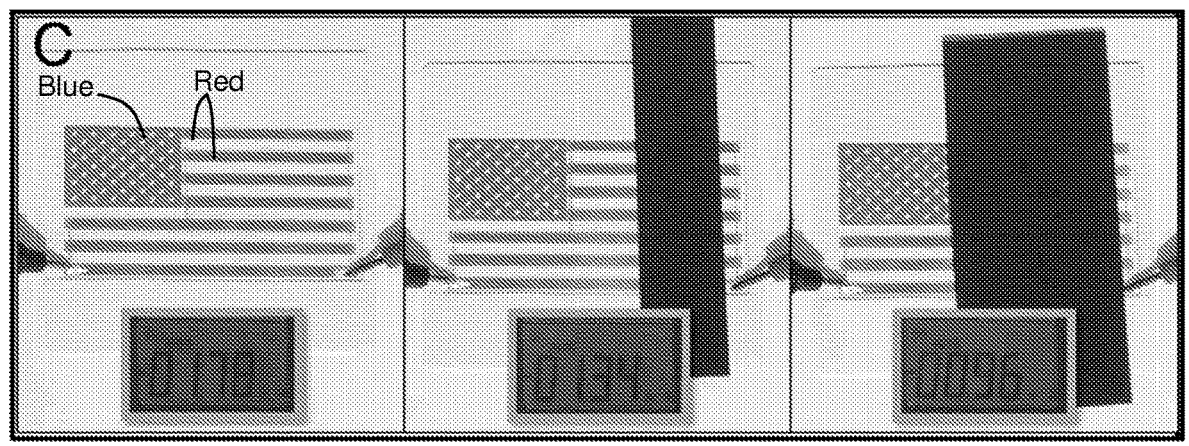
Figure 9D:
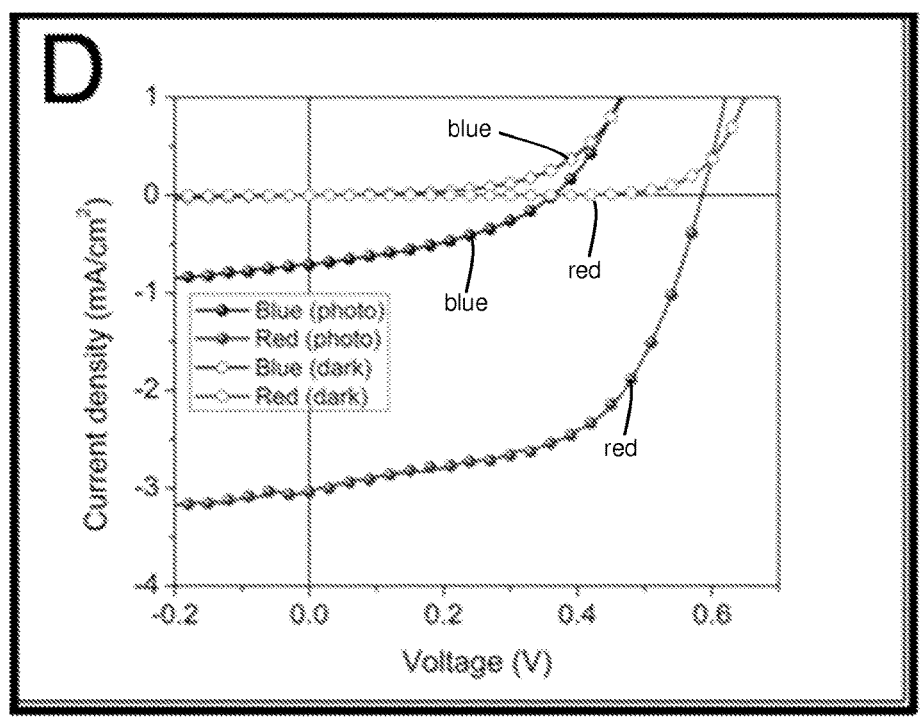

FIGS. 9(a)-9(d) show an example of a multi-colored design of an electric power-generating national flag of the United States of America prepared in accordance with certain aspects of the present teachings. FIG. 9(a) is a photograph of a U.S. flag taken outdoors, showing discrete blue (6 nm) and red (31 nm) colors. FIGS. 9(b)(1)-9(b)(5) show that the dual-function photovoltaic devices demonstrate angle insensitivity, where the U.S. flag maintains its colors at oblique angles of incidence up to about 60°, where the angles are manually controlled. FIG. 9(c) shows that the U.S. flag design generates electric current in outdoor sunlight (less than AM1.5). The electric current level decreases as U.S. flag becomes more fully covered by a piece of black paper. FIG. 9(d) shows current density-voltage performances of blue and red colored 1 mm diameter devices also characterized under AM1.5 illumination.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

In various aspects, the present disclosure contemplates ultra-thin hybrid photovoltaics with controllable color appearance. Thus, decorative photovoltaic devices are provided having hybrid functionality, including generating electric current and reflecting or transmitting filtered colored output. The filtered colored output from the devices displays angle insensitivity, so that the wavelength reflected or transmitted has only a minimal shift (e.g., minimal or no discernable color change) regardless of viewing angle. Such dual-function photovoltaic devices include a photoactive layer assembly sandwiched by electrodes. In certain variations, the photoactive layer assembly may include a thin or ultrathin film photoactive semiconductor layer, such as undoped amorphous silicon film. The photoactive layer assembly may also include at least one charge transport layer. In certain aspects, the charge transport layer is an organic charge transport layer. In certain other aspects, the photoactive layer assembly may further include an inorganic charge transfer layer along a side opposite to the first organic charge transport layer. Thus, the organic charge transport layer may be disposed on a first side of the photoactive layer, while a second opposite side of the photoactive layer is in contact with the inorganic charge transfer layer.

Such dual-function photovoltaic devices can create angle-insensitive (up to) 60° and polarization-independent reflected colors with high color purity. The hybrid functionality enables a new approach to address these challenges of conventional thin film photovoltaics by introducing ultra-thin hybrid photovoltaics comprising tens of nanometer-thick photoactive photon absorbing layers. In certain variations, the photoactive layer is an undoped amorphous silicon (a-Si). The a-Si photoactive layer may be combined with an organic charge transport layer to form an a-Si/organic hybrid solar cell. Such a solar cell is capable of filtering incident white light into a particular color with low sensitivity not only to the angle of incidence up to 60°, but also the polarization state of incident light. For the realization of the thin-film solar cells, amorphous Si (a-Si) is an attractive material because of its affordable fabrication. The colored hybrid photovoltaic cells according to the present teachings are capable of generating electricity (power conversion efficiency of greater than or equal to about 2%, optionally greater than or equal to about 3%) as well, which is based on recycling of the photons absorbed in a nanocavity.

In order to realize the hybrid photovoltaic cells without any p- and n-doping processes in accordance with certain aspects of the present disclosure, undoped intrinsic (i-) amorphous silicon (a-Si) active layer is formed as part of a photoactive layer assembly, which further includes both inorganic and organic charge transport layers for the anode and cathode, e.g., vanadium(V) oxide ($V_2O_5$) for holes/anode and indene-$C_{60}$ bisadduct (ICBA) for electrons/cathode. Owing to the ultra-thin photoactive layer thickness, which may be a thickness of less than or equal to about 50 nm, such thickness is an order of magnitude smaller than that of the typical p-i-n doped a-Si. Further, it is found that most of the absorbed photons are effectively converted to electric charges with the least amount of loss, because there is no detrimental recombination of photogenerated charges with p- and n-dopants. The present disclosure also provides that the colored cells having different resonance can be arranged to cover a wide spectrum of visible light, which can result in an enhancement of the power conversion efficiency.

In accordance with certain aspects of the present disclosure, a dual-function photovoltaic device is provided that can resolve the challenging problems described previously above. The novel functionality of nanometer undoped a-Si/organic hybrid solar cells provides an ability to engineer transmissive colors with the property of angle insensitivity as well as polarization independence. In certain variations, angle robustness can be maintained up to ±70 degrees. These characteristics are unattainable with conventional structures, thereby enabling electric power-generating colored panels. Such thin-film photovoltaic panels can be integrated with existing infrastructures, such as buildings and for various architectural designs.

In various aspects, the present disclosure contemplates ultra-thin colored hybrid photovoltaics can absorb light to fully generate electricity by efficient photon manipulation in a controlled manner. In accordance with certain aspects of the present disclosure, very thin inorganic and organic charge transport layers are employed to sandwich the undoped intrinsic (i-) a-Si active layer at the anode and cathode interfaces. In terms of a-Si photoactive layers, two unique properties are used in the dual-function a-Si hybrid cells according to certain aspects of the present teachings. The photoactive layers of the hybrid function cells may be substantially free of any p- or n-doped regions; and, for efficient photon management, the intrinsic a-Si active layer can be designed to be ultra-thin.

By substantially free of doping it is meant that the semiconductor layer comprising amorphous silicon does not have any intentional dopant introduced, nor is it associated with doping layers or regions. However, naturally occurring substances or impurities may be present in the semiconductor layer in very minor amounts that may be considered to be dopants, thus in certain aspects, substantially free of doping may mean that the semiconductor material comprises less than or equal to about 0.5 weight % of dopants in the material, less than or equal to about 0.1 weight % of dopants in the material, and optionally less than or equal to about 0.01 weight % of dopants in the semiconductor material.

The thickness of the ultra-thin photoactive layer is quite low, for example, an order of magnitude smaller than that of the typical p-i-n doped a-Si layer, and because the doped n and p regions (known to cause significant charge recombination) are eliminated in certain embodiments, a measured external quantum efficiency (EQE) of the devices closely matches the calculated optical absorption of the thin a-Si layer. As a result, the colored hybrid function cells can produce a power conversion efficiency that approaches 3%, despite the use of an a-Si layer about ten times thinner than that of traditional a-Si PVs. Benefited by incorporating ultra-thin undoped a-Si photoactive layer, most absorbed photons are converted to electric charges, thereby leading up to 3% or higher of power conversion efficiency (PCE). This achievement is believed to be due to the optical resonance effect and the suppression of charge recombination. By combining differently colored PV cells, preselected designs, patterns, and images can be obtained. Furthermore, multiple cells or devices can be arranged to absorb different ranges of the solar spectrum and whose reflection spectra compensate for each other, so that a cascaded photovoltaic configuration can be created with tunable spectrum splitting. Such a cascaded configuration uniquely exploits the spectrum-splitting concept to harvest a broad spectrum of solar light for higher efficiency.

FIGS. 1(a)(1)-1(a)(2) show an exemplary dual-function hybrid cell photovoltaic device 20 according to certain aspects of the present disclosure. The dual-function hybrid cell photovoltaic device 20 includes a photovoltaic cell assembly 30. The photovoltaic cell assembly 30 comprises an anode 32, a cathode 34, and a photoactive layer assembly 36. The anode 32 and cathode 34 sandwich the photoactive layer assembly 36. The photoactive layer assembly 36 includes an ultra-thin photoactive layer 40 and at least one charge transport layer 42. The ultra-thin photoactive layer 40 comprises a photoactive material, such as a semiconductor, for absorbing light and generating electric charge, as will be discussed in greater detail below. The charge transport layer 42 may be chosen to facilitate charge injection or transfer at the electrodes (e.g., at cathode 34) or alternatively one of the charge transport layers may be used to minimize or block a charge from reaching the opposite electrode and thus being wasted. Notably, while not shown, more than one charge transport layer 42 can be included in the photoactive layer assembly 36. While anode 32 may be a single metal layer or grating, the anode 32 is a dielectric-metal-dielectric assembly in the embodiment shown in FIGS. 1(a)(1)-1(a)(2). Thus, a first anode layer 44 comprises a dielectric material. A second anode layer 46 is a metal. A third anode layer 48 comprises a dielectric material. The first anode layer 44 and third anode layer 48 may have the same or different dielectric materials. As shown, the anode also includes an optional wetting layer 50. It should be noted that in certain aspects of the present disclosure, the first anode layer 44 that contacts the ultra-thin photoactive layer 40 could also serve as a second charge transport layer. For example, the first anode layer 44 may serve as a transport layer of holes between anode 32 and ultra-thin photoactive layer 40, while the charge transport layer 42 may serve as a transport layer of electrons between ultra-thin photoactive layer 40 to cathode 34.

The anode 32 or cathode 34 may comprise at least one metal layer. In certain variations, such a layer may comprise a metal selected from the group consisting of: silver, gold, aluminum, copper, and combinations thereof. For a dielectric-metal-dielectric anode 32 embodiment, the first anode layer 44 of the anode 32 may be vanadium pentoxide ($V_2O_5$), which may have an exemplary thickness of about 8 nm. The second anode layer 46 may be silver (Ag), optionally having a thickness of about 23 nm. The second anode layer 46 may also comprise silver (Ag) and aluminum (Al), by way of non-limiting example, in alternative variations. The third anode layer 48 may comprise tungsten trioxide ($WO_3$), which may have a thickness of about 20 nm. The third anode layer 48 may also include glass with the tungsten trioxide. The dielectric-metal-dielectric (DMD) anode structure (e.g., $WO_3$—Ag—$V_2O_5$) is exploited so that a large portion of incident light can be absorbed by the thin photoactive layer 40 in the photoactive layer assembly 36.

The $V_2O_5$ is included for building Schottky contact with the undoped a-Si photoactive layer 40, as well as transporting photogenerated holes effectively due to its high work function. The third anode layer 48 in the anode 32 is a thin Ag layer (with a thickness of about 23 nm) that allows incident light to go through the entire structure, and also provides high reflectivity, inducing more constructive interference, thereby a sharp resonance. Additionally, the thickness of Ag in the third anode layer 48 determines conductivity of the anode 32, of which sheet resistance is below 6 ohm/sq.

A wetting layer 50 may include perylenetetracarboxylic bis-benzimidazole (PTCBI). Such a wetting layer 50 is utilized for forming a continuous Ag film, which can reduce the scattering loss significantly. Despite the band gap of PTCBI (2.2 eV), it is found that the absorption loss of PTCBI layer can be trivial when deposited with a few nanometers in thickness. This interesting characteristic differs from what a few nanometers of germanium (Ge) provide.

Between the two electrodes (anode 32 and cathode 34), the photoactive layer assembly 36 is located, which includes a thin or ultra-thin photoactive layer 40 and at least one charge transport layer 42. In certain aspects, an "ultra-thin" layer has a thickness of less than or equal to about 50 nm, optionally less than or equal to about 45 nm, optionally less than or equal to about 40 nm, optionally less than or equal to about 35 nm, optionally less than or equal to about 30 nm, optionally less than or equal to about 25 nm, optionally less than or equal to about 20 nm, optionally less than or equal to about 15 nm, optionally less than or equal to about 10 nm, optionally less than or equal to about 9 nm, optionally less than or equal to about 8 nm, optionally less than or equal to about 7 nm, and in certain aspects, optionally less than or equal to about 6 nm. In certain aspects, an ultrathin layer has a thickness of greater than or equal to about 1 nm to less than or equal to about 31 nm, optionally greater than or equal to about 6 nm to less than or equal to about 31 nm, and optionally greater than or equal to about 10 nm to less than or equal to about 27 nm. In certain variations, the thin or ultrathin semiconductor or photoactive layer 40 is an undoped a-Si photoactive layer. In this variation, an ultra-thin dopant-free amorphous silicon photoactive layer may be embedded in an optical cavity as discussed above, which efficiently extracts photogenerated carriers, but also displays distinctive colors with the desired angle-insensitive appearances. In certain alternative variations, the thin semiconductor layer may comprise a perovskite photoactive material, such as methylammonium lead trihalide. In yet other alternative variations, other silicon-based materials, such as poly-silicon and nanocrystalline-silicon can also be used for the thin semiconductor photoactive layers. Other inorganic semiconductor materials, such as CdTe, $Cu(In,Ga)Se_2$ (CIGS), as well as organic semiconductors are also contemplated in certain alternative variations as the thin semiconductor photoactive layer.

Thus, the photoactive layer assembly 36 may be considered to have an ultra-thin photoactive layer 40 embedded in an optical cavity that not only efficiently extracts the photogenerated carriers, but also displays distinctive colors with the desired angle-insensitive appearances The photoactive layer assembly 36 includes the charge transport layer 42, which may be an organic material. The charge transport layer 42 may comprise a thin organic layer, such as indene-$C_{60}$ bisadduct (ICBA), which functions as a highly efficient photogenerated electron transport layer. ICBA's lowest unoccupied molecular orbital (LUMO) is well aligned with the a-Si conduction energy band. The ICBA may be adjacent to another organic material of bis-adduct fullerene surfactant ($C_{60}$ surfactant), which can reduce the work function of the Ag for ohmic contact between the Ag cathode 34 and the ICBA electron or charge transport layer 42. In certain alternative variations, the charge transport layer 42 may include other organic materials known or to be developed in the art for such applications. In certain variations, the cathode 34 may comprise a thick silver (Ag) firm, for example, having a thickness of about 120 nm, in one non-limiting embodiment. A 120 nm Ag film is thick enough to block the light penetration shown in FIG. 1(a)(1).

In one variation, a dual-function a-Si/organic hybrid solar cell is constructed on a transparent fused silica substrate. The main components of the hybrid cells are an anode, an ultra-thin a-Si layer, and a cathode with a thick silver (Ag) layer, as shown in FIGS. 1(a)(1)-1(a)(2). For the anode, a dielectric-metal structure (e.g., tungsten trioxide ($WO_3$)—Ag) is used to produce relatively high transmission. Following the anode, a high work function vanadium oxide ($V_2O_5$) serves as a hole-transporting layer for the undoped a-Si and simultaneously blocks electrons. Following the deposition of the a-Si layer, a thin organic layer of indene-$C_{60}$ bisadduct (ICBA) may be deposited to serve as an electron-transporting layer for the a-Si, because ICBA's lowest unoccupied molecular orbital (LUMO) is well aligned with the a-Si conduction energy band. Another organic material of bis-adduct fullerene surfactant ($C_{60}$ surfactant) is spin cast on top of the ICBA to lower the Ag work function, thus forming an ohmic contact between the ICBA and the thick Ag cathode. All anode and cathode materials, except the ICBA, were thermally evaporated with the same thicknesses, regardless of the device type, without breaking the vacuum below $1 \times 10_{-6}$ br. The ICBA was spin cast. The undoped a-Si layers are deposited using a plasma-enhanced chemical vapor deposition (PECVD) tool for colored PV devices.

All the anode and cathode materials, except ICBA and C60 surfactant, may be thermally evaporated for the same thicknesses, regardless of device types, without breaking the vacuum below $1 \times 10^{-6}$ mbar. The ICBA and C60 surfactant are spin cast all in the same conditions as well. The undoped a-Si layers are deposited by a plasma enhanced chemical vapor deposition (PECVD) tool for the thickness of 10, 18, and 27 nm for different device types. An anode of $WO_3$/Ag is thermally deposited onto a fused silica substrate, producing a sheet resistance below 6 ohm/sq. In the same chamber, without breaking the high vacuum ($10^{-6}$ mbar), $V_2O_5$ is deposited at a rate of 0.2 Ås$_{-1}$ to form a hole-transport layer. An undoped a-Si photoactive layer is deposited at 240° C. using $SiH_4$ gas in a PECVD apparatus with 13.56 MHz RF power. To create electron-transporting and Ag work function tuning layers, ICBA/chlorobenzene solution and $C_{60}$ surfactant are then spin cast onto the a-Si layer. Finally, thick Ag is thermally evaporated on top of the previous layers as a cathode electrode and a strong reflector. In this manner, a dual-function a-Si/organic hybrid solar cell is built on a transparent fused silica substrate, as the reflected light from the top metals passes through.

Thus, the dual-function hybrid cell photovoltaic device 20 in FIG. 1(*a*)(1) is of a reflective type. Broadband electromagnetic spectrum light 54 is directed towards the dual-function hybrid cell photovoltaic device 20, which generates a filtered output for a predetermined range of electromagnetic wavelengths. Three distinct predetermined ranges of wavelengths of reflected light 56, 58, 60 are shown, although the dual-function hybrid cell photovoltaic device 20 can be designed to reflect a variety of different wavelengths (including only a single wavelength, if desired). Thus, a portion of the electromagnetic spectrum is reflected in a predetermined range of electromagnetic wavelengths in a visible range to generate a colored surface. In preferred aspects, the filtered output is angle insensitive. Thus, in a reflective-type dual-function hybrid cell photovoltaic device 20, the three distinct predetermined ranges of wavelengths of reflected light 56, 58, 60 may be cyan, magenta, and yellow, by way of example.

Basically, the Fabry-Perot interference is strongly formed in the a-Si photoactive layer 40, yielding the high absorption of a certain wavelength component while reflecting the complementary spectrum, which creates the cyan, magenta, or yellow (CMY) color. FIG. 1(*b*) shows the measured and simulated reflection spectra at the normal incidence. There is a good agreement between the measured spectra and the simulated profiles. It is worthwhile to note that the imaginary part of a-Si becomes insignificant, which means that the material is becoming transparent as the wavelength increases. This results in lessened propagation loss through the a-Si film and accordingly narrower bandwidth, indicating that cyan color has the sharpest resonance among three colors shown in FIG. 1(*b*). By simply varying the thickness of a-Si layer photoactive layer 40, different colors can be obtained. In order to create CMY colors, a-Si photoactive layers 40 by the thickness of 27, 18, and 10 nm were used, respectively. The corresponding resonances (reflection dip) are found to be at 480, 560, and 635 nm.

In various aspects, the present disclosure provides dual-function hybrid cell photovoltaic and optical spectrum filtering devices that create one or more outputs displaying minimal angle dependence or angle insensitivity. The dual-function hybrid cell photovoltaic device is configured to funnel and absorb a portion of an electromagnetic spectrum to generate electric current, while also either reflecting or transmitting a filtered output having a predetermined range of wavelengths. The photovoltaic device thus generates electric current, but also a filtered output having a predetermined range of wavelengths that displays angle insensitivity. By displaying angle insensitivity, the predetermined range of wavelengths varies less than or equal to about 20 nm from an incidence angle of 0 to an incidence angle of 60° with respect to the dual-function device, optionally less than or equal to about 20 nm from an incidence angle of 0 to an incidence angle of 70° with respect to the dual-function device. Thus, angle robustness can be maintained up to ±70 degrees. Further, such solar cells provide an ability to engineer transmissive or reflective colors with the property of angle insensitivity, while also being polarization independent (independent of the polarization state of incident light). The predetermined range of wavelengths of the filtered output that exits the dual-function device may be in a visible light range.

The dual-function photovoltaic device may thus also serve as a color filter that generates electricity and distinct filtered outputs and thus, distinct colors. Particularly suitable visible and infrared electromagnetic radiation includes, visible light having wavelengths ranging from about 390 to about 750 nm and infrared radiation (IR) (including near infrared (NIR) ranging from about 0.75 to about 1.4 µm). Filtered electromagnetic radiation can have a wavelength in a range of about 625 nm to 740 nm for red; about 590 nm to about 625 nm for orange; about 565 nm to about 590 nm for yellow; about 520 nm to about 565 nm for green; about 500 nm to about 520 nm for blue or cyan; about 435 nm to about 500 nm for blue or indigo; and about 380 nm to about 435 nm for violet. Further, in certain aspects, the filtered light may be extra-spectral or a mixture of several different wavelengths. For example, magenta is an extra-spectral mixture of red (625 nm to 740 nm) and blue (435 nm to 500 nm) wavelengths.

In certain aspects, the filtered colored output from the dual-function devices according to the present disclosure is a highly pure color, so that a range of wavelengths reflected or transmitted are within a narrow bandwidth, for example, within a bandwidth of greater than or equal to about 10 nm to less than or equal to about 25 nm.

Both transmission and reflection color filtering can be achieved by filter devices prepared in accordance with the present teachings. Thus, in certain variations, the optical spectrum filtering device may be a transmission-type filter, while in other variations; the optical spectrum filtering device may be a reflection-type filter. In yet other variations, the optical spectrum filtering device concurrently exhibits both a transmission and reflection-type filter.

In one example, FIGS. 1(*c*)(1)-1(*c*)(4) show photographs of the inventive dual-function reflective color filter devices at different angles of incidence demonstrating angle insensitivity. FIGS. 1(*c*)(2)-1(*c*)(4) show the fabricated colored dual-function photovoltaic filter devices at various angles of incidence (15°, 30°, and 60°. Distinct cyan, magenta, and yellow (CMY) colors can be created, which is due to the strong interference behaviors in the a-Si layer. The high color purity shown implies the reflection spectra with narrow bandwidth and high contrast. It is apparent that the CMY colors do not change their original colors even by viewing in a large angle. The colored cells clearly demonstrate the angle insensitive performance at large angles of incidence, showing high contrast and no change in appearance of color even at high viewing angles.

The reason for the strong, angle-independent resonance that is observed is believed to be as follows. For a highly absorbing photoactive material (e.g., a-Si, for which the imaginary part of the refractive index is comparable to the real part at visible frequencies), the phase change upon the reflection at the interface between an optically lossy medium and a metal varies from 0 to π because of the complex refractive index of the metal in the visible range and the large absorption of the lossy medium, which is markedly different from the case of a transparent medium. These non-trivial reflection phase changes enable the desired resonance to be created in an ultra-thin cavity where the thickness of the absorbing material is much smaller than the wavelength of the incident light. The inventive photovoltaic devices exploit this property to produce an angle-insensitive color appearance because the propagation phase through the ultra-thin Si layer is reduced and can be partially cancelled out by the reflection phase shifts at the interface between the a-Si and the metal.

Another key feature of the inventive dual-function reflective color filter cells is their low sensitivity to the polarization state of the incident light, which means that light of any polarization can be fully absorbed by the a-Si active layer and thus contribute to the photocurrent generation. This is a highly desirable feature, as sunlight and ambient light are mostly unpolarized.

Additional significant characteristic is the simple process to fabricate such a filter on a large substrate, compared to most nanostructure-based plasmonic and photonic devices. The nanostructure-based filters must have patterned patches or subwavelength gratings in order to modify a resonant wavelength, which require traditional lithographic techniques such as laser ablation or other etching methods. As the fabrication of the filters in accordance with certain aspects of the present disclosure only involves the deposition processes, the inventive technology can be directly applied to expand the laboratory-based fabrication to the industry level production.

The electrical performance of colored dual-function photovoltaic devices is characterized through current density vs. voltage (J-V) measurements. Circular-shaped devices of 1 mm in diameter formed in accordance with the method above are tested under illumination with AM1.5 simulated sunlight (100 mW cm$_{-2}$). The intensity of the light is uniformly distributed throughout the cell area by the optical setup. A KEITHLEY™ 2400 instrument is used for the data acquisition of the current and voltage values during J-V characterization. The power conversion efficiency of each colored cell is determined from the average values of $J_{sc}$, $V_{oc}$, and FF of multiple cells on the same substrate. For optical performance characterization, the reflection spectra of the colored PV cells at normal incidence are measured using a spectrometer (HR4000CG, Ocean Optics). A halogen lamp was used as a white light source. Angular dependent spectra are obtained using a variable angle spectroscopic ellipsometer (VASE sold by J. A. Woollam Co., Lincoln, Nebr., USA) from 15° to 60° for both s and p polarizations. Simulations of the electric field profiles, the reflection, the absorption in the a-Si layer, and the angular dependent spectra are performed using a transfer matrix method. Broadband white light from 400 nm to 800 nm is used as the input illumination. The complex wavelength-dependent optical constants of all materials are measured using a spectroscopic ellipsometer (M-2000, J. A. Woollam Co., Lincoln, Nebr., USA) with a B-spline fitting function and are then used in the simulations.

The numerical analysis of angular reflected spectra are obtained by a transfer matrix method, and presented in FIGS. 2(a)-2(c). The resonance (reflection dip) of each color is invariant with respect to the angle of incidence up to ±60°, which can be confirmed by a flat dispersion curve. Experimentally, angular behaviors are measured by variable angle spectroscopic ellipsometer (VASE) from angles of 15° to 60° under p-polarized light illumination demonstrated in FIGS. 2(d)-2(f). The measured angular reflected responses match fairly well with the result from the simulation. In addition, the light absorption is strongly confined within the thin a-Si layer at the resonance wavelength (FIGS. 2(g)-(j)), facilitated by the higher n and k values of a-Si compared with the other layers. The high concentration of the field within the a-Si film contributes to the photocurrent generation.

The mechanism of the angle-insensitive feature is believed to be because a negligible phase accumulation occurs from the propagation through the ultra-thin a-Si film in comparison with the unconventional phase shifts upon reflection at the interface between metal and a-Si. As a result of this, the directional dependence can be improved. It should be noted that inventive color filters have another key feature of low sensitivity to the polarization state of incident light. When considering that sunlight is unpolarized light, the polarization independence is an attractive property as both s- and p-polarized light can be fully absorbed in the a-Si active layer and then contributed to electric charges.

Another benefit of certain variations of the hybrid dual-function photovoltaic colored devices according to certain aspects of the present disclosure occurs due to the absence of doped p and n layers in the a-Si based cell. The thin organic and metal-oxide interfacial layers have much lower refractive indices than doped a-Si layers and therefore do not significantly affect the optical resonance. Moreover, they also facilitate the extraction of the photogenerated charge to the electrodes with significantly reduced recombination.

A dual function photovoltaic device is tested for electric power conversion efficiency. The dual function photovoltaic device is a circle island type by 1 mm diameter similar to that used in an EQE measurement. The photographs in FIG. 3(a) show reflected cyan, magenta, and yellow colors from three such inventive devices with a background tower. The devices for both optical and electric performance evaluations are all fabricated in the same process.

In FIG. 3(b), absorption spectra of a-Si active layers are theoretically simulated. On the whole, absorption characteristics in the ultra-thin active layers correspond well to the electrically measured external quantum efficiency (EQE) spectra with the discrepancies for the magenta and cyan devices where the EQE spectra show slightly lower profiles than the simulated absorptions of a-Si at longer wavelengths. This discrepancy is attributed to the fabrication imperfections, such as physical defects and surface roughness, thus causing the resonance behavior to be destroyed. It is evident that a scenario with stronger interference (i.e., more round trips of light reflected by the two electrodes) can be more strongly affected by defects and imperfections. The cyan has the strongest resonance effect since a-Si becomes transparent with longer wavelengths, thus, it is evident that stronger interference can be affected more significantly than the cases of yellow and magenta.

The measured EQE spectrum contains electrical contact efficiency as well as internal quantum efficiency (IQE) in the photoactive/transporting layers, which represents actual photon-to-charge conversion efficiency. The loss of charges at the electrical contacts is presumed to be negligible in the 1 mm diameter device size, and the IQE is regarded to be outstandingly high after the consideration of broken resonance.

The simulated absorption spectra and measured EQE spectra match remarkably well, indicating that most of the absorbed photons are harvested and contribute to the photocurrent with negligible electron-hole recombination. This high efficiency arises because the thickness of the active layer is much smaller than the typical charge-diffusion length in a-Si, and therefore, most photogenerated charges are efficiently extracted to the electrodes via the organic/inorganic (electron/hole) transporting layers.

As anticipated from the comparison of the a-Si absorption with the EQE curves, ultra-thin a-Si hybrid cells according to the present disclosure have two notable advantages with regard to suppressing undesirable electron-hole recombination throughout photoactive layers. The first is that the active layer thickness is much smaller than the typical charge diffusion length in a-Si, thus most photogenerated charges are successfully extracted to the organic/inorganic (electron/hole) transporting layers. The suppressed charge recombination can significantly mitigate the light-induced degradation of a-Si solar cells. It is also well known that the charge recombination in p- and n-doped regions is one of main charge loss dynamics in traditional p-i-n a-Si solar cells. In this regard, without p- and n-doping in the a-Si active layer, the undoped layer absorbs all the photons, accordingly allowing photogenerated charges to be transported, not being recombined with dopants, which is another benefit of the inventive hybrid cells. This expectation is supported by the electrical characterization, which is presented in FIG. 3(c). Considering the EQE characteristics of the hybrid PV cells illustrated in FIG. 3(b), a fairly similar electric current performance from the yellow cell (10 nm) and the magenta cell (18 nm) is expected even though their thicknesses differ by a factor of nearly two.

In order to prove the unusual power efficiency trend, current density-voltage under AM1.5 illumination and dark conditions is measured as shown in FIG. 3(c). The current density-voltage curves in FIG. 3(c) describe the average efficiency performance of multiple devices for each type (cyan, magenta, or yellow). As observed from the EQE spectra in FIG. 3(b), the yellow device has very similar current density (6.50 mA/cm$^2$) to the magenta one (6.79 mA/cm$^2$), having comparable fill factor above 60%. This result is consistent with the similar integrated EQEs seen in FIG. 3(b) for the yellow cell (10 nm) and the magenta cell (18 nm) despite their difference in thicknesses. It is important to note that the magenta device generates almost 3% power efficiency with an undoped a-Si photoactive layer with only 18 nm thickness. This is a remarkable result when compared with the record 10% efficiency obtained for a single-junction cell using a 250 nm intrinsic a-Si layer, which is over 10 times thicker than the device here. This result demonstrates that the efficient photon management achieved through the establishment of optical resonance and the reduced charge recombination in ultra-thin a-Si plays an important role in the dual-function photovoltaic cells. All three types of devices regardless of their thicknesses (10 nm-27 nm), operated well having fill factor over 60%.

Experimentally, it is confirmed that three types of devices operate well for electric power efficiency of which short circuit current performance can be controlled by optical calculation. The novel concept of the inventive hybrid cells can be easily applied to other thin-film inorganic material systems, filtering a variety of colors simultaneously based on the customized photon management in their active layers.

An optical design principle is further explored here. In the ultra-thin hybrid structures described above, because of the strong F-P resonance formed between the reflecting electrodes, the device produces high absorption of a certain wavelength component while reflecting the complementary spectrum. By simply varying the thickness of the a-Si layer inside the F-P resonator, different colors can be obtained. For example, to create the CMY colors, a-Si layers having thicknesses of 27 nm, 18 nm, and 10 nm are used, respectively, and the corresponding resonances (reflection dips) are observed at 630, 560, and 480 nm. FIG. 3(d) presents the measured and simulated reflection spectra at normal incidence, which exhibit excellent agreement. It is worth noting that the imaginary part of a-Si becomes insignificant at longer wavelengths, which results in lessened propagation loss through the a-Si film and a correspondingly narrower bandwidth. Therefore, the cyan-colored device has the sharpest resonance among the three colors represented in FIG. 3(d).

Table 1 shows performance of such cyan, magenta, and yellow colored dual-function photovoltaic cells, including overall efficiency, photocurrent (Jsc), open circuit voltage, and fill factor.

TABLE 1

|  | Efficiency (%) | Jsc (mA/cm$^2$) | Voc (V) | FF (%) |
| --- | --- | --- | --- | --- |
| Cyan device | 1.92 | 4.89 | 0.62 | 63 |
| Magenta device | 2.80 | 6.79 | 0.65 | 64 |
| Yellow device | 2.36 | 6.50 | 0.60 | 61 |

The thickness of the top metal layer in the dielectric-metal-dielectric (DMD) anode also has an effect on the electrical performance of hybrid photovoltaic cells prepared in accordance with certain aspects of the present disclosure, particularly the photocurrent $J_{sc}$ show that in general a thicker metal layer leads to higher reflection. Thus, higher reflection increases the quality-factor (Q-factor) of the F-P resonance, leading to the production of higher color purity. However, a trade-off arises in reduced a-Si absorption and lower power conversion efficiency. Therefore, in certain variations, an ultra-thin metal with low loss is desirable, such as Ag with the introduction of a small amount of Al to produce a sub-10 nm thick smooth Ag film.

Colored dual function photovoltaic cells according to certain aspects of the present disclosure exhibit a strong resonance behavior with a certain bandwidth, which is verified by both experimentally measured EQE spectrum and the numerically calculated absorption profile in a-Si layer. As the device possessing the resonance absorbs the definite spectral bands in the visible spectrum and therefore naturally reflects its complementary color, such peculiar nature of resonance can enable splitting of the entire visible spectrum into a number of different bands to be absorbed individually. Moreover, the resonance with the angle robustness can be fully controlled by changing the thickness of a-Si film.

There has been increasing interest in the use of a spectrum-splitting approach to spread the solar spectrum into multiple bands and use semiconductor photovoltaics with the appropriate band gap for each band. This approach has the potential to yield record high efficiency without the need of engineering sophisticated vertical tandem cell structures for broadband absorption. However, conventional spectrum-splitting approaches always require a specifically designed external element to spread the spectrum, such as a filter, grating, prism, or beam splitter. Such an external element is not required in the cascaded configuration contemplated in certain variations of the present disclosure, for example, as shown in FIG. 4(a). Due to strong resonance behavior, a colored PV device prepared in accordance with the present techniques can absorb a certain predetermined spectral band of solar light and naturally reflect its complementary spectrum, which can be harvested by another cell with a different resonance wavelength. Simply altering the thickness of the photoactive a-Si layer in the PV cell enables the resonance to be shifted in a controllable manner. The angle-insensitive behavior of these devices is also advantageous for cascading multiple stages of PV cells.

A cascaded solar cell platform 80 can be constructed with a tunable spectrum splitting configuration as illustrated in FIG. 4(*a*), thus spanning a wide range of wavelengths. To implement the cascaded architecture, three dual function colored photovoltaic cells 82-86 are designed with different thickness of an a-Si photoactive layer, each of which can result in a different position of the resonance. A first cell 82 has a thickness of 10 nm, a second cell 84 has a second thickness of 16 nm, and a third cell 86 has a thickness of 26 nm. The corresponding resonance of each cell is at 480 nm (first cell 82), 545 nm (second cell 84), and 630 nm (third cell 86), reflected in the insets. As shown in FIG. 4(*a*), broadband light 90 (shown with red, orange, yellow, green, blue, indigo, and violet wavelengths) is incident upon the first cell 82 having a resonance at 545 nm at an oblique angle (e.g., about)30°, which mainly absorbs the green band of the visible light (500-600 nm), and hence reflects the complementary color (magenta), still largely containing the blue and red wavelength regimes. By spatially steering such an unabsorbed complementary spectrum 92 toward the second cell 84 with resonance at 630 nm, the longer wavelength components encompassing the orange and red colors in the spectral range of 600 to 700 nm are re-utilized to generate electricity. Despite the large absorption coefficient of a-Si in shorter wavelength regimes, more than half of incident energy in the vicinity of blue spectral region still remains since previous two cells have the resonance at green and red domains. This second unabsorbed spectrum 94 is directed towards the third cell 86. The third cell 86 absorbs the rest of light, particularly the shorter wavelength region corresponding to the blue spectrum (400-500 nm), not harvested by first two cells 82, 84. The spectral band arising from the accumulated absorption is denoted by the dotted line in the inset.

To study the optical and electrical characteristics of the cascaded solar cell platform 80, the absorption spectrum in a-Si is calculated, and measured EQE for the three cells, which are compared in FIG. 4(*b*). In general, the calculated spectra are quite consistent with the experimental EQE data with a discrepancy at longer wavelength. From the overall EQE and a-Si absorption spectra depicted in FIG. 4(*c*) (sum of three profiles), it is shown that broad wavelength range of incident light energy from 400 to 700 nm can contribute to the generation of electricity, thereby validating the efficacy of the cascaded solar cell platform concept.

Note that it may be difficult for a-Si material to absorb the optical spectrum beyond 700 nm due to the band gap of a-Si (1.7 eV). Current density-voltage characteristics in the individual cells (FIG. 4(*d*)), and in the cascaded system (FIG. 4(*e*)) are shown, the latter of which shows that the short circuit current density of the second and third cells is further reduced as the consecutive cells have less amount of light left for a-Si absorption, as compared to the first cell. Even wider wavelength range of light can be harvested by employing a smaller band gap semiconductor material as a fourth cell.

A complex design is formed on a dual function colored photovoltaic electric power-generating device in accordance with certain aspects of the present disclosure. FIG. 5(*a*) shows a University of Michigan (U of M) logo fabricated on a large area (4 inch by 2.3 inch). The maize and blue colors are well defined. The U of M logo generates electric current under outdoor sunlight (less than AM1.5). Current density-voltage performance of 1 mm diameter devices for both colors on the same substrate is characterized in FIG. 5(*b*). This power-generating U of M logo implementation is one non-limiting example of various colored designs possible with photovoltaic applications in accordance with various aspects of the present disclosure. The concepts discussed in the present disclosure can be expanded to other ultra-thin inorganic solar cells using different material systems. The devices and methods provided by the present disclosure can be used in a wide range of technologies ranging from reflective displaying/light emitting systems to decorative glasses for commercial buildings, residential houses, and interior furnishings, by way of non-limiting example.

In certain variations, the present disclosure further provides decorative transparent or semi-transparent power generating panels including transmission-type dual-function photovoltaic devices with angle insensitive colors. In certain aspects, nanometer a-Si/organic hybrid cells are designed to transmit angle insensitive colors, electrically powering up to 2% or more by efficient absorbed photon to charge conversion.

FIGS. 6(*a*)(1)-6(*c*)(3) show an exemplary schematic of transmission-type transparent dual-function photovoltaic device structure according to certain aspects of the present disclosure. FIG. 6(*a*)(1) shows a transmissive photovoltaic device 100 comprising a cathode 102, an anode 106, and a photoactive layer 104. The cathode 102 is disposed on a side of the photovoltaic device 100 that receives incident light 101, while the anode is positioned on the opposite side. The anode 106 and cathode 102 sandwich the photoactive layer 104. The anode 106 and cathode 102 are designed to work as electrodes and to selectively transmit specific optical spectra as well. The ultra-thin photoactive layer 104 comprises a photoactive material, such as a semiconductor, for absorbing light and generating electric charge, as described previously above. The photoactive layer 104 may thus comprise an ultra-thin semiconductor material layer. In certain aspects, the ultra-thin semiconductor material is an undoped a-Si photoactive layer. The anode 106 is disposed on a glass substrate 108. As shown, incident sunlight 101 is directed towards the cathode 102. The transmissive photovoltaic device 100 filters the light to form a filtered output 110 for a predetermined range of electromagnetic wavelengths, which creates a colored surface on the transmissive photovoltaic device 100. The filtered output 110 desirably displays minimal angle dependence, as discussed above.

The anode 106 or cathode 102 may comprise at least one metal layer. In certain variations, such a layer may comprise a metal selected from the group consisting of: silver, gold, aluminum, copper, and combinations thereof. While anode 106 may be a single metal layer or grating, the anode 106 prepared in accordance with certain aspects of the present disclosure is an expanded dielectric-metal-dielectric assembly (DMD), as shown in FIGS. 6(*a*)(1)-6(*a*)(2). Thus, a first anode layer 112 comprises a dielectric material. The first anode layer 112 may be tungsten trioxide ($WO_3$) and may have an exemplary thickness of about 25 nm. A second anode layer 114 is an optional wetting layer, which facilitates even continuous coverage of an applied metal layer. The second anode layer 114 may be perylenetetracarboxylic bis-benzimidazole (PTCBI) applied at an exemplary thickness of about 5 nm. A third anode layer 116 comprises a metal layer. The third anode layer 116 may comprise silver (Ag) at an exemplary thickness of about 11 nm. A fourth anode layer 118 is a dielectric material. The dielectric material in the first anode layer 112 and fourth anode layer 118 may be the same or may be different from one another. In the fourth anode layer 118, the dielectric material may be vanadium pentoxide ($V_2O_5$), which may have an exemplary thickness of about 8 nm. It should be noted that in certain aspects of the present disclosure, the fourth anode layer 118 that contacts the ultra-thin photoactive layer 104 may also serve as a charge transport layer. For example, the fourth anode layer 118 may serve as a transport layer of holes between anode 106 and ultra-thin photoactive layer 104, while another the charge transport layer (120 described below) in the cathode 102 may serve as a transport layer of electrons between ultra-thin photoactive layer 104 and cathode 102.

Similarly, cathode 102 prepared in accordance with certain aspects of the present disclosure is a multi-layer assembly, as shown in FIGS. 6(a)(1) and 6(a)(3). Thus, a first cathode layer 120 is a charge transport layer, which serves to inject and transfer electrons between ultra-thin photoactive layer 104 and cathode 102. In certain preferred aspects, the first cathode layer 120 comprises an organic charge transport layer. In certain variations, the first cathode layer 120 is a thin organic layer comprising indene-$C_{60}$ bisadduct (ICBA), as described previously above, which operates as a very efficient photogenerated electron transport layer as its lowest unoccupied molecular orbital (LUMO) level (well leveled with a-Si conduction energy band). The first cathode layer 120 includes another organic material of bis-adduct fullerene surfactant ($C_{60}$ surfactant) applied over the ICBA, reducing Ag work function and forming ohmic contact between the cathode electrode and the ICBA electron transport layer (first cathode layer 120). The first cathode layer may have ICBA applied at an exemplary thickness of about 5 nm, with the $C_{60}$ surfactant applied thereto at a nominal thickness.

A second cathode layer 122 is a metal layer. The second cathode layer 122 may comprise silver and have an exemplary thickness of about 14 nm. A third cathode layer 124 comprises a dielectric material. The third cathode layer 124 may be tungsten trioxide ($WO_3$) applied at an exemplary thickness of about 20 nm. A fourth cathode layer 126 is an optional wetting layer. The optionally wetting layer 126 may be formed of PTCBI applied at an exemplary thickness of about 5 nm. A fifth cathode layer 128 comprises a metal layer. The fifth cathode layer 128 may comprise silver and have an exemplary thickness of about 14 nm. A sixth cathode layer 130 is a dielectric material. The dielectric material in the third cathode layer 124 and fourth cathode layer 126 may be the same or may be different from one another. Here, sixth cathode layer 128 comprises the same tungsten oxide ($WO_3$) dielectric material having an exemplary thickness of about 35 nm.

The transmissive photovoltaic device 100 prepared in accordance with certain aspects of the present teachings is an ultra-thin undoped a-Si/organic hybrid solar cell that is built on fused silica substrates having a simple design of an anode, an ultra-thin a-Si layer, and a cathode. As noted above, the anode 106 and cathode 102 are designed to work as electrodes and to selectively transmit specific optical spectra as well. The electrodes are basically expanded dielectric-metal-dielectric structures. For the anode 106, tungsten trioxide ($WO_3$) and vanadium (V) oxide ($V_2O_5$) are used for dielectric materials in the first anode layer 112 and the fourth anode layer 118, respectively, and silver (Ag) as a metal in the third anode layer 116. The $V_2O_5$ of the fourth anode layer 118 is utilized for building Schottky barrier with undoped a-Si as well as transporting photogenerated holes efficiently due to its high work function. The thin Ag (11 nm) of the third anode layer 116 is located between two dielectric layers (first and fourth anode layers 112, 118) in the anode 106; here the Ag thickness determines conductivity of the electrode, of which sheet resistance is below 10 ohm/sq.

The cathode 102 includes the first cathode layer 120 discussed above comprising a thin organic layer of indene-$C_{60}$ bisadduct (ICBA). The cathode 102 also has a combination of repeating layers of Ag and $WO_3$ (second and third cathode layers 122, 124 and fifth and sixth cathode layers 128, 130) with different thicknesses according to theoretical calculations. All the anode and cathode materials, except ICBA and $C_{60}$ surfactant, are thermally evaporated for the same thicknesses, regardless of device types, without breaking the vacuum below $1\times10^{-6}$ mbar. The ICBA and $C_{60}$ surfactant are spin cast all in the same conditions as well. The undoped a-Si layers are deposited by a plasma enhanced chemical vapor deposition (PECVD) tool for the thickness of 6 nm, 11 nm, and 31 nm for different device types.

In designs according to certain aspects of the present disclosure, a bottom thin Ag layer (second cathode layer 122) is utilized to increase the reflection at the interface between Ag and $V_2O_5$ and consequently a quality factor (Q-factor) yielding a narrow bandwidth. Silver is selected for both top and bottom cathode 102 and anode 106 electrodes, because Ag has the highest reflectivity and the lowest absorption at visible frequencies. A strong resonance behavior arises from the Fabry-Perot cavity comprising a highly lossy material, a-Si, sandwiched by two metals. While ICBA, $C_{60}$ surfactant, and $V_2O_5$ can contribute to the resonance, the resonance is primarily determined by the a-Si layer due to the high refractive index of a-Si.

An organic material, PTCBI, is used as a wetting layer, which can make the surface of Ag dramatically smooth comparable to what has been observed with germanium (Ge), thus minimizing the scattering loss. Although the surface morphology of optically thin Ag film even on 1 nm Ge layer becomes significantly flat, Ge is a highly absorbing material, attributed to the presence of the direct electronic transitions in the visible regime resulting in lower transmission efficiency as well as broadened bandwidth. On the other hand, the surface roughness of deposited Ag film on thin PTCBI layer can be greatly reduced, maintaining original transmittance and bandwidth owing to the low absorption coefficient of PTCBI at visible frequencies.

Optical and electrical characterizations are conducted on devices formed in accordance with certain aspects of the present disclosure with the spectroscopic ellipsometer and other equipment and techniques described previously above. For optical performance measurement, transmission spectra of the decorative power generating cells for incident angles ranging from 0° to 70° are measured by using a spectrometer (HR4000CF, Ocean Optics) under unpolarized, TE-, and TM-polarized light illumination. The electrical property of the dual-function transmissive PV devices formed in accordance with certain aspects of the present disclosure is experimentally measured by current density-voltage (J-V) characterizations. 1 mm diameter size circular-shaped devices are characterized under illumination by AM1.5 simulated sunlight (100 mWcm$^{-2}$). An optical setup is designed to uniformly distribute the intensity of the light illumination throughout the cell area. For the data acquisition of electrical current and voltage in J-V measurements, Keithley 2400 is connected to the cathode and anode of solar cell devices. Power conversion efficiency of each decorative cell (red, green, or blue) is calculated by the average values of $J_{sc}$, Voc, and FF obtained from multiple cells on the same substrate.

The dual-function transmissive photovoltaic devices are fabricated by first depositing an anode comprising $WO_3$/Ag by a thermal evaporation process on a glass substrate, which shows a sheet resistance below 10 ohm/%. For a hole transporting layer, $V_2O_5$ is deposited at a rate of 0.2 $A°s^{-1}$ in the same chamber with a high vacuum ($10^{-6}$ mbar). After that, an intrinsic a-Si layer is deposited by using a plasma enhanced chemical vapor deposition (PECVD) process at 240° C. ($SiH_4$ gas with 13.56 MHz RF power). As an electron transporting layer, the solution of ICBA with chlorobenzene solvent is spin-casted on the photoactive layer. These layers are then covered by a transparent cathode consisting of $WO_3$/Ag deposited by using a thermal evaporation. To demonstrate the custom-made color and pattern of the undoped dual function a-Si hybrid PV cells, four steel shadow masks are designed for the U.S. flag, which generates an electric current under outdoor sunlight as discussed below. The anode and cathode shadow masks are utilized in the thermal evaporator for the metal oxides or Ag depositions. In PECVD chamber, the blue and red pattern masks are applied to deposit the two different thicknesses of a-Si for blue and red colors in the U.S. flag, respectively.

The calculated (solid line) and corresponding measured (dotted line) transmission spectra of individual colors at the normal incidence are depicted in FIG. 6(b). The experimental spectra show an excellent agreement with the simulated profiles. The change in the thickness of an a-Si film, given the fixed thicknesses for the other layers, enables tuning so that red, green, and blue (RGB) colors are selectively transmitted. The a-Si photoactive layer thicknesses of 6 nm, 11 nm, and 31 nm determine the transmission peaks located at 478 nm (blue), 542 nm (green), and 720 nm (red), respectively. Formation of such devices involves a simple fabrication process involving only film deposition.

The photograph images of fabricated samples are shown in FIG. 6(c)(1)-6(c)(3). Fountain and buildings can be seen through the transmissive dual-function inventive photovoltaic devices with distinct colors. It is noteworthy to mention that there is no change in color even with oblique angles of incidence. In addition, methods of forming such transmissive dual-function photovoltaic devices in accordance with the present disclosure are advantageous, as only deposition steps are used. The methods according to the present disclosure avoid any lithography processes, such as etching or patterning, which have been typically utilized to alter the resonance in most photonic devices. The simplicity of the processes in accordance with the present disclosure enables device fabrication on a large substrate without much difficulty, thereby making the present teachings particularly desirable for expansion to industry levels of production.

To investigate the angular dependence of transmissive dual-function photovoltaic devices prepared in accordance with certain variations of the present teachings, a simulation is performed: the calculated dispersion curve is illustrated in FIGS. 7(a)-7(c). This clearly shows that the resonances of RGB filters corresponding to the peak of transmittance are retained up to ±70 degrees, showing flat dispersion curves. This angle insensitivity is experimentally verified by the measured transmissive spectral responses for incident angle varying from 0 to 70 degrees under unpolarized light illumination (FIGS. 7(d)-7(f)), and confirmed to be in excellent correspondence with the calculated spectra. The behavior observed here is totally different from conventional Fabry-Perot interference whose resonant wavelength is inherently varied with respect to the angle of incidence.

The angle robustness can be attributed to the ultra-thin photoactive layer thickness (e.g., undoped a-Si thickness), which as discussed above leads to the relatively insignificant phase change accumulated during the propagation, compared to the phase shift occurring upon the reflection at the interface. Thus the resonance can remain fairly unvaried as the angle of incidence gets bigger. Regarding the solar cell performance of the transmissive dual-function photovoltaic devices cells, the angle robustness is also very beneficial so that no external sun tracking system is required (as the devices accept wide ranges of sunlight incidence). Another important feature of the transmissive dual-function photovoltaic devices according to various aspects of the present disclosure is the polarization independence exhibited. As all common light sources, including the sun, fluorescent, and ambient light, produce the unpolarized light, the transmissive dual-function photovoltaic devices according to various aspects of the present disclosure utilize all kinds of incident light to generate electricity efficiently. The angular behaviors for transverse electric (TE) and transverse magnetic (TM) polarization are demonstrated, as well.

Considering the a-Si photoactive layer, the inventive transmissive dual-function photovoltaic devices according to certain aspects of the present disclosure having an ultra-thin a-Si photoactive layer have the following unique traits, by way of non-limiting example. The a-Si active layer is entirely undoped without any p- or n-dopants; and, for efficient photon management, the undoped a-Si active layer is designed to be ultrathin, as described above, which is much thinner than the active layer of conventional p-i-n a-Si solar cells. Such characteristics are also beneficial for the extraction of photogenerated charges electrically.

As shown in FIG. 8(a), transmissive dual-function photovoltaic devices according to certain aspects of the present disclosure having undoped a-Si active layers displaying red, green, and blue colors are shown. In FIG. 8(b), absorption spectra of a-Si active photoactive layers versus wavelength are calculated for the red, green, and blue device types. Remarkably, the electrically measured external quantum efficiency (EQE) spectra are well matched with the absorption spectra. The EQE spectrum contains electrical contact efficiency as well as internal quantum efficiency (IQE) in the photoactive/transporting layers, which represents actual photon-to-charge conversion efficiency. Since it can be assumed that the charge loss at the electrical contacts is negligible in 1 mm diameter device size, the IQE spectrum is considered to be almost approaching 100%.

As expected from the comparison of the a-Si absorption and the EQE curves, the transmissive dual-function photovoltaic devices according to certain aspects of the present disclosure have two outstanding benefits in terms of suppressing undesirable electron-hole recombination throughout photoactive layers. The one is that, regardless of device types (red, green, or blue), the active layer thickness is much thinner than the typical charge diffusion length in a-Si, so most of photogenerated charges are extracted to electron/hole transporting layers. The suppressed charge recombination can significantly mitigate the light-induced degradation, which is a drawback of traditional doped a-Si solar cells. The other advantage is that, without p- and n-doped regions in the a-Si active layer, all the photons get absorbed in an undoped layer, accordingly allowing photogenerated charges to be transported, not being recombined with dopants. The charge recombination with p- and n-dopants in the doped layers is one of major charge loss dynamics in p-i-n a-Si solar cells. Many studies have focused on optimizing p- and n-layer thicknesses to lessen the charge loss in the doped regions without sacrificing an internal electric field.

The transmissive dual-function photovoltaic devices according to certain aspects of the present disclosure permit accurate estimation of electric current from the simulated optical absorption spectrum in an active layer. As the total number of photons absorbed in the active layer is very similar to the total extracted charges, the electric current performance of the solar cells can be designed before fabricating devices simply based on the optical calculation.

According to the EQE characteristics of the hybrid cells, interestingly, it is expected that higher electric current performance would be obtained from the green cell (11 nm) than from the red cell (31 nm). In order to verify the result of more power efficiency from the three times thinner active layer cell, current density-voltage characteristics under AM1.5 illumination and dark conditions are measured shown in FIG. 8(c). The device measured is also sized by 1 mm diameter as in the EQE characterization. FIG. 8(a) shows photographs where one building is viewed through the large size red, green, and blue devices. The large size and 1 mm diameter devices are fabricated in the same process.

The current density-voltage curves in FIG. 8(c) show the average efficiency performance of multiple devices for each type (red, green, or blue). As expected from the EQE spectra previously, the green device has much higher current density (5.69 mA/cm$^2$) than the red one (3.42 mA/cm$^2$) with comparable fill factors (58~59%). The green device generates almost 2% power efficiency by only 11 nm of undoped a-Si active layer. More detailed power conversion efficiency factors of the three types of devices are summarized in Table I.

|  | Efficiency (%) | Jsc (mA/cm$^2$) | Voc (V) | FF (%) |
|---|---|---|---|---|
| Red device | 1.08 | 3.42 | 0.54 | 59 |
| Green device | 1.94 | 5.69 | 0.59 | 58 |
| Blue device | 0.73 | 3.54 | 0.48 | 43 |

The blue device with 6 nm of a-Si active layer operated well as a solar cell, even though the fill factor of the blue device is lower than the other types of devices. It is presumed that a few nanometer undoped a-Si active layer of the blue device induces more electric charge leaking paths in the device area, thereby reducing shunt resistance of the solar cell compared to the red and green devices, having thicker undoped a-Si active layers.

Experimentally, it is confirmed that the three types of devices (red, green, and blue) worked well for electric power efficiency, generating short circuit current density as designed in optical simulation. Such transmissive dual-function photovoltaic devices according to certain aspects of the present disclosure provide higher power efficiency, filtering various colors based on appropriate photon management in their active layers.

Another demonstration is provided for creating polarization-independent and angle-insensitive color devices having the ability to generate electric power at the same time, a 3 inch by 2.3 inch power-generating national flag of the United States of America (U.S. flag) is created, as shown in FIGS. 9(a)-9(b)(5). The ultra-thin undoped a-Si thickness enables both blue (6 nm) and red (31 nm) colors as introduced in accordance with principles of the present disclosure. In addition, an angle of incidence is changed from normal to 60 degrees in order to verify the angle invariance performance of the power-generating U.S. flag. See FIGS. 9(b)(1)-9(b)(5). Remarkably, the two distinct blue and red colors in the U.S. flag can be maintained at oblique angles of incidence as shown in FIGS. 9(b)(1)-9(b)(5). In terms of electric power performance, the U.S. flag generates almost 2 mA electric current under real outdoor sunlight (less than AM1.5) with full light exposure to the flag (FIG. 9(c)). When the flag is covered by a piece of black paper, the current level evidently drops by the ratio of the flag's open area. Current density-voltage characteristics are measured by 1 mm diameter devices in the same U.S. flag sample (FIG. 9(d)). The realization of various transmission colors is readily available as well by simple tuning a-Si layer thickness.

In certain aspects, a hybrid or dual-function photovoltaic structure is provided by use of a photoactive layer assembly comprising a first charge transport layer comprising metal oxide (which is associated with a first electrode) and a second charge transport layer (which is associated with a second electrode) serving as an organic interfacial charge transport. The photoactive layer assembly also comprises an ultrathin photoactive layer, which may be an undoped a-Si photoactive layer. Use of a very thin a-Si layer, not only satisfies the requirement for semi-transparent color generation, but also offers several unique non-limiting advantages. Because the a-Si layer thickness is an order of magnitude thinner than the traditional doped a-Si photovoltaic devices, the photo-carrier recombination is effectively minimized, which leads to high quantum efficiency of the device. Second, distinct colors can be generated by resonant optical transmission. However, different from the F-P resonance, where the net of round-trip propagation phase inside the cavity and the reflection phase is multiples of 2 p, the inventive structures employ the extraordinary phase change of light reflecting from a light-absorbing medium (in this case undoped a-Si) and metal interface to achieve constructive light interference. A direct benefit of this is that the devices according to certain aspects of the present disclosure achieve angle-insensitive colors, due to the negligible phase change of light propagating through the ultra-thin a-Si layer as compared with the unusual reflection phase. Moreover, devices provided by the present teachings are also insensitive to the polarization of the incident light, making such devices particularly suitable for semi-transparent decorative PV applications.

Transmissive dual-function photovoltaic structures prepared in accordance with certain aspects of the present disclosure, including undoped a-Si/organic hybrid cells, can be tuned to pass blue, green, and red colors. Simultaneous power generation is achieved with high efficiencies. Further, the dual-function photovoltaic structures have high angular tolerance of the transmitted colors. In certain alternative aspects, the dual-function photovoltaic structures may also include different inorganic materials systems, so that the power-generating decorative panels can be applied to modern buildings or for spectral selective applications, including dual-function glass roofs for greenhouses to absorb green and ultraviolet light for electric power generation, while passing blue and red light to be absorbed by the chlorophyll for plant growth, by way of non-limiting example.

Thus, in various aspects, dual-function photovoltaic devices according to certain aspects of the present disclosure can have a power conversion or electric power efficiency (EQE) of greater than or equal to about 1.75%, optionally greater than or equal to about 1.8%, optionally greater than or equal to about 1.9%, optionally greater than or equal to about 2%, optionally greater than or equal to about 2.25%, optionally greater than or equal to about 2.5%, optionally greater than or equal to about 2.75%, optionally greater than or equal to about 2.8%, optionally greater than or equal to about 2.9%, and in certain variations, optionally greater than or equal to about 3%. For example, in transmissive dual-function photovoltaic devices according to certain aspects of the present disclosure, absorbed light can be successfully recycled to achieve electric power efficiency up to or exceeding 2%, while filtering vivid red, green, and blue colors simultaneously. The ultra-thin hybrid photovoltaic cells according to the present teachings address the polarization independent high angular tolerance of colors, as well as the availability of photon management in the photoactive layers. Notably, most of the absorbed photons in the undoped a-Si layer are converted to the electric charges, benefitted by the suppressed electron-hole recombination. This new principle can be easily utilized in different inorganic materials systems as well, so that the power-generating decorative panels having tunable colors, can be used in various industries and applications.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A dual-function photovoltaic device comprising:
an anode comprising a first metal,
a cathode comprising a second metal, and
a photoactive layer assembly disposed between the anode and the cathode, the photoactive layer assembly being substantially free of doping and comprising a semiconductor active layer comprising an amorphous silicon (a-Si) having a thickness of less than or equal to about 50 nm, a first charge transport layer, and a second charge transport layer sandwiching the semiconductor active layer; wherein the anode, the cathode and the photoactive layer assembly together create an optical resonator so that the dual-function photovoltaic device is configured to generate electric current and to display a colored surface appearance by reflecting or transmitting a filtered output in a predetermined range of electromagnetic wavelengths in a visible range.

2. The dual-function photovoltaic device of claim 1, wherein the semiconductor active layer has a thickness of greater than or equal to about 6 nm to less than or equal to about 31 nm.

3. The dual-function photovoltaic device of claim 1, wherein the filtered output for a predetermined range of electromagnetic wavelengths in a visible range varies less than or equal to about 20 nm from an incidence angle of 0 to 60° with respect to the dual-function photovoltaic device.

4. The dual-function photovoltaic device of claim 3, wherein the filtered output is either transverse-magnetic (TM) polarity light and/or transverse-electric (TE) polarized light.

5. The dual-function photovoltaic device of claim 1, wherein a power conversion efficiency is greater than or equal to about 2%.

6. The dual-function photovoltaic device of claim 1, wherein a power conversion efficiency is greater than or equal to about 3%.

7. The dual-function photovoltaic device of claim 1, wherein the anode comprises a dielectric-metal-dielectric structure comprising vanadium pentoxide ($V_2O_5$), silver (Ag), and tungsten trioxide ($WO_3$).

8. The dual-function photovoltaic device of claim 1, wherein the first charge transport layer is adjacent to the cathode and comprises an organic material comprising indene-$C_{60}$ bisadduct (ICBA).

9. The dual-function photovoltaic device of claim 1, wherein the cathode comprises silver.

10. The dual-function photovoltaic device of claim 1, wherein the cathode comprises a metal-dielectric-metal-dielectric structure comprising ordered layers of silver (Ag), tungsten trioxide ($WO_3$), silver (Ag), and tungsten trioxide ($WO_3$).

11. The dual-function photovoltaic device of claim 1, wherein the dual-function photovoltaic device is a transmission-type device and the predetermined range of electromagnetic wavelengths of the filtered output has a color selected from the group consisting of: red, green, blue, and combinations thereof.

12. The dual-function photovoltaic device of claim 1, wherein the dual-function photovoltaic device is a reflection-type device and the predetermined range of electromagnetic wavelengths of the filtered output has a color selected from the group consisting of: cyan, yellow, magenta, and combinations thereof.

13. The dual-function photovoltaic device of claim 1, wherein the filtered output has a bandwidth of less than or equal to about 25 nm.

14. A dual-function photovoltaic device comprising:
an anode comprising a first metal,
a cathode comprising a second metal, and
a photoactive layer assembly disposed between the anode and the cathode, the photoactive layer assembly being substantially free of doping and comprising a semiconductor active layer comprising an amorphous silicon (a-Si) having a thickness of greater than or equal to about 6 nm to less than or equal to about 31 nm, a first charge transport layer comprising an organic material, and a second charge transport layer sandwiching the semiconductor active layer; wherein the anode, the cathode and the photoactive layer assembly together create an optical resonator so that the dual-function photovoltaic device is configured to generate electric current and to display a colored surface appearance by reflecting or transmitting a filtered output for a predetermined range of electromagnetic wavelengths in a visible range that varies less than or equal to about 20 nm from an incidence angle of 0 to 60° with respect to the dual-function photovoltaic device.

15. The dual-function photovoltaic device of claim 14, wherein the dual-function photovoltaic device is a transmission-type device and the predetermined range of electromagnetic wavelengths of the filtered output has a color selected from the group consisting of: red, green, blue, and combinations thereof.

16. The dual-function photovoltaic device of claim 14, wherein the dual-function photovoltaic device is a reflection-type device and the predetermined range of electromagnetic wavelengths of the filtered output has a color selected from the group consisting of: cyan, yellow, magenta, and combinations thereof.

17. The dual-function photovoltaic device of claim 14, wherein the minimal angle dependence is for either transverse-magnetic (TM) polarity light and/or transverse-electric (TE) polarized light.

18. The dual-function photovoltaic device of claim 14, wherein a power conversion efficiency is greater than or equal to about 2%.

19. The dual-function photovoltaic device of claim 14, wherein the anode comprises a dielectric-metal-dielectric structure comprising vanadium pentoxide ($V_2O_5$), silver (Ag), and tungsten trioxide ($WO_3$).

20. The dual-function photovoltaic device of claim 14, wherein the first charge transport layer is adjacent to the cathode and the organic material comprises indene-$C_{60}$ bisadduct (ICBA).

21. The dual-function photovoltaic device of claim 14, wherein the cathode comprises silver.

22. The dual-function photovoltaic device of claim 14, wherein the cathode comprises a metal-dielectric-metal-dielectric structure comprising ordered layers of silver (Ag), tungsten trioxide ($WO_3$), silver (Ag), and tungsten trioxide ($WO_3$).

* * * * *